(12) United States Patent
Romanovskii et al.

(10) Patent No.: US 11,177,825 B2
(45) Date of Patent: Nov. 16, 2021

(54) DEVICE AND METHOD FOR COMPACTING COMPRESSED AND UNCOMPRESSED DATA BLOCKS

(71) Applicant: Huawei Technologies Co., Ltd., Shenzhen (CN)

(72) Inventors: Aleksei Valentinovich Romanovskii, Saint (RU); Ilya Aleksandrovich Papiev, Saint (RU); Jinbao Niu, Hangzhou (CN); Qiang Xue, Chengdu (CN); Shaohui Quan, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/984,935

(22) Filed: Aug. 4, 2020

(65) Prior Publication Data
US 2020/0366314 A1  Nov. 19, 2020

Related U.S. Application Data

(63) Continuation of application No. PCT/RU2018/000523, filed on Aug. 9, 2018.

(51) Int. Cl.
*H03M 7/40* (2006.01)
*H03M 7/46* (2006.01)

(52) U.S. Cl.
CPC .............. *H03M 7/40* (2013.01); *H03M 7/46* (2013.01)

(58) Field of Classification Search
CPC .... H03M 7/3088; H03M 7/4031; H03M 7/42; H03M 7/6076; H03M 7/6011; H03M 7/46; H03M 7/6035; H03M 7/3086; H03M 7/30; H03M 7/3084; H03M 7/40; H03M 7/70; H03M 7/6005; H03M 7/3066; H03M 7/3068; H03M 7/3071; H03M 7/3079; H03M 7/4006; H03M 7/4043; H03M 7/4062; H03M 7/4075; H03M 7/6017; H03M 7/6064; H03M 7/607; H03M 7/6082; H03M 7/6088; H03M 7/702
USPC ........................ 341/51, 65, 67, 87, 106, 107
See application file for complete search history.

(56) References Cited

U.S. PATENT DOCUMENTS

| | | | | |
|---|---|---|---|---|
| 6,606,328 B1* | 8/2003 | Susnow | ................. | H03M 5/145 341/58 |
| 8,497,788 B1* | 7/2013 | Miller | ................. | H03M 7/3093 341/87 |
| 8,619,866 B2* | 12/2013 | Zhou | ....................... | H04N 19/61 375/240.24 |
| 2007/0061546 A1* | 3/2007 | Berger | .................... | H03M 7/30 711/202 |

(Continued)

*Primary Examiner* — Linh V Nguyen
(74) *Attorney, Agent, or Firm* — Leydig, Voit & Mayer, Ltd.

(57) ABSTRACT

A device and a method for an improved compacting of compressed and uncompressed data blocks into an output buffer are provided. The device is configured to obtain a set of input data blocks comprising at least one of a compressed data block and an uncompressed data block; compact the compressed data blocks into the output buffer, starting from a first predefined region in the output buffer, such that the compressed data blocks are sequentially compacted; and compact the uncompressed data blocks into the output buffer, starting from a second predefined region in the output buffer, such that the uncompressed data blocks are sequentially compacted.

20 Claims, 19 Drawing Sheets

(56) References Cited

U.S. PATENT DOCUMENTS

| | | | |
|---|---|---|---|
| 2011/0150351 A1* | 6/2011 | Singh | H04N 19/91 |
| | | | 382/234 |
| 2012/0030377 A1* | 2/2012 | Inoue | H03M 7/30 |
| | | | 709/247 |
| 2012/0203955 A1 | 8/2012 | Kim et al. | |
| 2012/0290798 A1 | 11/2012 | Huang et al. | |
| 2014/0189281 A1 | 7/2014 | Sokol, Jr. | |
| 2014/0208003 A1 | 7/2014 | Cohen | |
| 2016/0357478 A1 | 12/2016 | Myrick et al. | |
| 2018/0300606 A1* | 10/2018 | Corkery | G06F 1/324 |
| 2019/0190537 A1* | 6/2019 | Fukui | G10L 19/0017 |
| 2020/0042500 A1* | 2/2020 | Li | G06F 3/061 |

* cited by examiner

DEVICE AND METHOD FOR COMPACTING COMPRESSED AND UNCOMPRESSED DATA BLOCKS

CROSS-REFERENCE TO RELATED APPLICATIONS

This application is a continuation of International Application No. PCT/RU2018/000523, filed on Aug. 9, 2018, which is hereby incorporated by reference in its entirety.

TECHNICAL FIELD

Embodiments of the present disclosure generally relate to the field of data compression and data compaction. More specifically, embodiments of the present disclosure relate to a device and a method for compacting compressed and uncompressed data blocks into an output buffer. Embodiments of his disclosure also relate to devices and methods that reduce wasted space on a storage media, for example, when storing compressed data blocks.

BACKGROUND

Lossless data compression is one of the algorithms used in All-Flash-Array-storage devices. Data compression may reduce stored data size when written to the storage devices. Moreover, when compressed data blocks are read from the storage devices, they are further decompressed to original contents and sizes. In primary storage devices, the data compression and decompression are done, "in-line" or on-the-fly, transparently, for an application that writes and reads data.

Furthermore, the lossless data compression may increase the effective storage capacity of a storage device, and therefore, more data may be stored on the storage device. In addition, since less data is written to the storage device such as a Solid State Drive (SSD), the data compression may decrease the SSD's wear, and hence, the durability of the SSD may be increased.

Conventional devices (e.g. storage vendors) provide a compression ratio (CR) of 4:1, in other words, the used algorithms of the conventional storage vendors compress data four times as compared to its original size. Besides, some computer programs and/or applications write data (e.g., input data block) to storage devices in blocks having a fixed size, and compression of these blocks may in turn produce compressed data blocks having different sizes.

Furthermore, if the input data block is non-compressible, then its compression may produce an output block having a bigger size than the input block, as a result of, for example, compression of metadata overhead, etc. In such a case, the result of compression may be discarded by storage pipeline, and the original input data block may be written to the storage device.

Some computer programs and/or applications may read data blocks from the storage devices in an arbitrary way, for example, non-sequentially. Moreover, in order to speed-up read operations of compressed data blocks from the storage devices at arbitrary addresses, additional data structures for address indirection (e.g., address translation) may be used due to a variable size of compressed data blocks.

Conventionally, in order to perform inline data compression, the compressed data blocks are written using so-called grain units having a fixed size of 1 kilo-byte (KB). For instance, if 8 KB of input data blocks are compressed into 3.5 KB of compressed data blocks, then four of the 1 KB grain units are required to write the compressed data blocks. In such cases, the compressed data blocks may be written to storage media using the grain units. In addition, the size and offset of the written compressed data blocks may be expressed based on the grain units.

Some other algorithms may then be used to compact (also hereinafter referred to "pack") the grain units with compressed data into so-called chunks (also hereinafter referred to "output buffer"), for example, chunks having fixed sizes of 1 Mega-byte (MB), etc.

FIG. 14 schematically illustrates conventional compression of an 8 KB input data blocks, and further packing of the compressed data blocks into chunks.

The input data blocks with the size of 8 KB are initially compressed. The compressed data blocks are then packed into chunks. Two chunks (i.e. chunk 1 and chunk 2) having fixed size of 1 MB are schematically shown in FIG. 14. Both of the chunks contain compressed data blocks and uncompressed data blocks, which are packed by 1 KB grain unit alignment.

Moreover, the Chunk identifier (Chunk ID), the data offset and the data size (also hereinafter referred to length) are combined in the block address (grain address). The block addresses can be used for address indirection (i.e. address translation) in random read scenarios.

FIG. 15 schematically illustrates unpacking and decompression from chunks with packing by 1 KB grain unit alignment, in prior art.

Two chunks including a chunk 1 and a chunk 2 are schematically shown in FIG. 15, which are based on the two chunks of FIG. 14. The chunks have fixed size of 1 MB, and include compressed data blocks and uncompressed data blocks, which are packed by 1 KB grain unit alignment.

As discussed, the block address includes the chunk ID, the offset and the length. Initially, the block addresses are used and the data (i.e. the packed compressed data) are unpacked. Next, the compressed data blocks are decompressed to the output data blocks of 8 KB.

As it is shown, the block addresses, which include chunk ID, offset and length, are used for reading, unpacking and then decompression of data from chunks.

Moreover, the discussed method in FIG. 14 and FIG. 15 uses a 1 bit per grain unit, in order to mark the data in-use (e.g., as alive) and/or deleted. The used 1 bit per grain unit is required for a garbage collector algorithm that performs storage defragmentation.

However, the above discussed conventional method has the disadvantage that the last grain unit of the compressed data block often contains less than 1 KB of the compressed data block, and hence, the unused space of the grain unit is wasted.

For example, if input data blocks with the size of 8 KB are compressed into 2 KB+1B, three grain units with the size of 1 KB are required for the packing. Since only 1 byte of the third grain unit will be used, 1023 bytes in the third grain unit will be wasted.

Hence, the above discussed conventional method has the disadvantage that it creates wasted space, for example, wasted space formed when packing the compressed data blocks into chunks.

FIG. 16 schematically illustrates such formation of wasted space in grain units when compressed data blocks are packed by 1 KB grain unit alignment.

In FIG. 16, four compressed data blocks are packed by 1 KB grain unit alignment. The first compressed data block occupies two grain units, each having a fixed size of 1 KB. Since the first block size is less than 2 KB, a part of the second grain unit is wasted. Similarly, the second compressed data block occupies the third, the fourth, and the fifth grain units, and part of the fifth grain unit is wasted. Moreover, the third compressed data block occupies the sixth, and the seventh grain units such that a part of the seventh grain unit is wasted, etc.

FIG. 17 schematically illustrates formation of a wasted space in grain units when compressed and uncompressed data blocks being packed by 1 KB grain unit alignment.

In FIG. 17, several blocks including compressed data blocks of B0, B1, B3, B4, B5 and Bn, and uncompressed data blocks of B2 and B6 are packed into the chunk, by 1 KB grain unit alignment.

Initially, two uncompressed data blocks of B0 and B1 are packed into the chunk. As it can be seen, two wasted spaces are formed, a first wasted space is located between B0 and B1 and the second wasted space is located in the last grain unit occupied by B1 (fifth grain unit of the chunk). Then, the uncompressed data block of B2 is packed into the chunk, following by the compressed data blocks of B3, B4, and B5, etc. Moreover, several wasted spaces are formed between the compressed data blocks, i.e., a wasted space between packed data blocks of B3 and B4, a wasted space between packed data blocks B4 and B5, etc.

The above discussed method has the disadvantage that it creates a wasted space, which, for example, occurs when the last grain units of the compressed data blocks often contain less than 1 KB, and the used spaces in the grain units are wasted. For instance, with an average compression ratio of 2:1, a chunk with a size of 1 MB may contain 256 compressed data blocks. Moreover, the 1 MB chunk may further include an average waste size of 128 KB (512×256=128 KB) per 1 MB of chunk, which results in a wasted space of 12.5% of the chunk, where 512 bytes is an average waste in last 1 KB grain of a compressed data block.

A bigger size of waste, 256 KB or 25% of the chunk, is also accumulated, for example, when input data blocks with a size of 8 KB are compressed on average into 3 KB+1B.

In addition to the space waste in the storage media, there is also a waste in a central processing unit being called a CPU waste. The CPU waste occurs when, for example, the compressed data blocks are discarded, since they do not fit into e.g. six grain units. The limit for the size of the compressed data blocks in the above discussed method is imposed due to inefficient bits usage in block address. The above discussed conventional method uses three bits for compressed data block size, which are expressed in 1 KB grain units. For instance, when the bit pattern of "111" is used for uncompressed data blocks, the bit pattern "000" is invalid, and the other six bit patterns are for compressed data blocks with the sizes in the range of 1 to 6 grain units.

In the conventional devices and methods, any compressed data block that requires 6 KB or more is discarded, and the respective CPU cycles are wasted. Hence, the above discussed method generates a CPU waste in addition to the space waste in the storage media, which is an extra disadvantage.

FIG. 18 illustrates a disclosed method in prior art for compaction of compressed and uncompressed data blocks into a solid state drive (SSD) memory.

For example, the input data corresponding to input files are initially compressed. The compressed data blocks have the sizes of 0.5 KB, 1.0 KB, 2.0 KB, 1.3 KB, 1.0 KB, 0.5 KB, 0.5 KB, 1.0 KB and 2.0 KB, respectively, and are ready to be written to the SSD. Without a data compaction, one block of SSD with a size of 4 KB will be allocated to each file (i.e. to each compressed data block), which overall consume 36 KB of the storage device.

Alternatively, a data compaction of the compressed data blocks enables multiple files to be written to each of the 4 KB blocks, and therefore, only 12 KB of the storage device will be consumed.

However, in the above discussed method, the sum of the multiple blocks compacted in one block of 4 KB may be less than 4 KB (e.g., 3 KB, 3.5 KB, etc.) and therefore, a wasted spaces may be formed in each 4 KB blocks.

Hence, the above discussed method has the disadvantage that wasted spaces are formed between, for example, the compressed data blocks when being compacted into the SSD. Moreover, another drawback for the method is a read amplification may occur when "waste bytes" being read.

FIG. 19 illustrates another method described in US 2012/0290798 A1, for compression and compacting of input data files into a memory device.

The HOST column in FIG. 19 shows a plurality of data sectors grouped according to logical addressable units (LAUs), with four data sectors per LAU. There are five LAUs labelled as LAA0 through LAA4.

The data sectors shown in the HOST column are uncompressed sectors. After compression, the sectors take up less space. For example, the sectors in LAA0 stored in the DDR are all compressed to 50%, and LAA0 therefore takes up 50% of a block of memory in the DDR. The compacting scheme is not employed on LAUs written to the DDR, so some space within the DDR memory blocks remains empty. The sectors in LAA1 are also compressed to 50% and sectors in LAA2 are compressed to 25%. The data sectors in LAA3 are not uniformly compressible, but the overall compression ratio of LAA3 is 50%. LAA4 is compressed with a compression ratio of 100%.

Upon being compacted, the LAUs will be grouped together into hardware addressable unit (HAUs). The firmware causes the LAUs stored in the double data rate (DDR) to be written to the storage device (SSD) as compacted into single HAUs within.

However, the above discussed method creates a wasted space, for example, the wasted space may be formed between the compressed data blocks, and when the compressed sector sizes are rounded. In addition, a wasted space may also be formed during compacting in the SSD.

Although, there exist techniques for compressing and compacting input data files into a storage device, e.g., by compacting each input data file into a separate block of 4 KB size, it is generally desirable to improve devices and methods for compacting compressed and uncompressed data blocks into an output buffer and/or a storage media.

SUMMARY

In view of the above-mentioned problems and disadvantages, embodiments of the present disclosure aim to improve the conventional devices and methods for data compression and compaction. Embodiments of the present disclosure have thereby the objective to provide a device and a method for compacting compressed and uncompressed data blocks into an output buffer. In particular, less space should be wasted when compressing and compacting the date into the buffer.

The objective of the present disclosure is achieved by the solution provided in the enclosed independent claims. Advantageous implementations of the present disclosure are further defined in the dependent claims.

A first aspect of the present disclosure provides a device for compacting compressed and uncompressed data blocks into an output buffer, wherein the device is configured to obtain a set of input data blocks comprising at least one of a compressed data block and an uncompressed data block; compact the compressed data blocks into the output buffer, starting from a first predefined region in the output buffer, such that the compressed data blocks are sequentially compacted; and compact the uncompressed data blocks into the output buffer, starting from a second predefined region in the output buffer, such that the uncompressed data blocks are sequentially compacted.

According to the first aspect formation of a wasted space between compressed data blocks is significantly reduced or even eliminated. For example, for a selected lossless data compression of a LZ4 algorithm, waste elimination may be close to "ideal" with the device of the first aspect. In other words, the compressed data blocks may be compacted (e.g. sequentially) such that there is no wasted space between two adjacent compressed data blocks. Moreover, a better data reduction ratio may be achieved, for example, a data reduction ratio between 13-27% may be obtained by the device of the first aspect. Therefore, also an increase in the speed (e.g., write and read speed) up to 6-42% compared to typical inline compression packing scheme of the conventional devices can be obtained.

Another advantage of the device of the first aspect is that it deals with actual compressed data sizes in packing scheme, and decreases waste of SSD memory to minimum as compared to typical inline compression packing schemes. For example, a wasted space may be decreased to a 0.1% level of the memory storage.

In an implementation form of the first aspect, the device is further configured to determine an upper limit in bytes for a compressed data block to be compacted into the output buffer, based on the output buffer size, the size of the compressed data block, and its header size.

By means of determining the upper limit in bytes for the compressed data block, the device is able to allocate a predetermined space in the output buffer (e.g., based on the determined upper limit) for the compressed data block to be compacted into the output buffer.

In an implementation form of the first aspect, the device is further configured to obtain an input data block, compress the obtained input data block based on a predefined compression ratio, and determine the size of the compressed data block.

This is beneficial, since with compressing the obtained input data block, the device reduces the data size when written to the storage device.

In an implementation form of the first aspect, when it is determined that the size of the compressed data block is less than the grain unit of output buffer, the device performs a copy-add of the compressed data into a separate output buffer being associated to the compressed data blocks having a size smaller than the grain unit, wherein the grain unit is representative of granularity of a memory storage.

By means of allocating a separate output buffer for the compressed data blocks having a size smaller than the grain unit, the formation of a wasted space in the grain units containing small data blocks may be avoided. Therefore, not only a wasted space in the grain unit may be avoided, but also several small data blocks are copied into the separate output buffer, and the memory storage is efficiently used.

In an implementation form of the first aspect, the first predefined region is the beginning of the output buffer, and wherein the compressed data blocks are sequentially compacted from the beginning of the output buffer growing toward the end of the output buffer.

This is beneficial, since the compressed data blocks are compacted next to each other, and the formation of the wasted space between the compressed data blocks may be reduced and/or eliminated. Moreover, since the compressed data blocks are compacted, based on their actual sizes, waste of the storage media can be decreased to minimum.

In an implementation from the first aspect, the compaction of the compressed data blocks into the output buffer is gapless and/or independent from the grain unit of the output buffer.

By means of compacting the compressed data blocks in a gapless method and/or independent from the grain unit, the device is able to reduce and/or eliminate the wasted space that otherwise would be formed, for example, after the compressed data block stored in the grain unit. For instance, the device is able to use the actual compressed data blocks with variable sizes. Hence, the device overcomes the drawbacks in the conventional devices, in which the wasted space remains in each compressed data block and accordingly in the storage media, i.e., in conventional devices rounded sizes are used instead of the actual size of the compressed data blocks.

In an implementation form of the first aspect, the second predefined region is the end of the output buffer, and wherein the uncompressed data blocks are sequentially compacted from the end of the output buffer growing toward the beginning of the output buffer.

This is beneficial, since the uncompressed data blocks are compacted next to each other, and the formation of the wasted space between the uncompressed data blocks can be reduced and/or eliminated.

In an implementation from the first aspect, the compaction of the uncompressed data blocks into the output buffer is arranged based on the grain unit of the output buffer.

This is beneficial, since the uncompressed data blocks have sizes which are based on the grain units of the output buffer. Therefore, there will be no wasted space between two and/or more uncompressed data blocks, since they are arranged based on the grain unit of the output buffer.

In an implementation from the first aspect, the device is further configured to calculate a block address for the compressed data block based on determining an offset for the compressed data block in the output buffer, and estimating a length of the compressed data block in the output buffer.

This is beneficial, since the block address, offset and length are calculated and thus the device is able to allocate, for example, a temporary buffer based on the calculated block address, determined offset and the estimated length. Consequently, the compressed data blocks can be more efficiently, for example, read, write, stored, or the like.

In an implementation form of the first aspect, the block address of a compressed data block having a size less than the grain unit is corresponding to an index of the grain unit.

Using an index of the grain unit enables calculating the block address for the compressed data blocks with the size smaller than the grain unit. Hence, a block address for the small compressed data blocks can be calculated.

In an implementation form of the first aspect, the device is further configured to calculate a block address for the uncompressed data block based on determining an offset for the uncompressed data block in the output buffer, and estimating a length of the uncompressed data block in output buffer.

This is beneficial, since calculating the block address for the for the uncompressed data blocks, enables allocating a space, e.g., at the end of the chunk for the uncompressed data blocks. Therefore, the uncompressed data blocks can be more efficiently, for example, read, write, stored, or the like.

In an implementation form of the first aspect, the device is further configured to generate a block leading header for each compressed data block, being representative of an offset from the beginning of the grain unit.

Generating the block leading header determines the position of the compressed data block relative to the beginning of the grain unit. Moreover, an offset in bytes for compressed data block can be determined, which may be stored at the beginning of the first grain unit of the compressed data blocks in the chunk.

In an implementation form of the first aspect, the device is further configured to generate a block trailing header for each compressed data block, being representative of an offset of the last byte of the compressed data block from the beginning of the last grain unit of the compressed data block.

Generating a block trailing header enables determining an offset of the last byte of the compressed data block from the beginning of the last grain unit of the compressed data block. Moreover, the trailing header may be placed at the beginning of the last grain unit of the compressed data block.

For example, in some embodiments, the compressed data block may occupy 3 KB+1 byte. Moreover, presuming that the 3 KB include the leading header, then 1 byte remains at the last grain unit of the compressed data block. Furthermore, the device may insert the trailing header at the beginning of the last grain unit of the compressed data block (e.g., assuming that the trailing header is 2 bytes), thus the last grain unit of the compressed data block may be 3 bytes, where 2 bytes are for the trailing header and 1 byte is for the compressed data block. In such a case, the trailing header may contain an offset of 3.

In an implementation form of the first aspect, the device is further comprising a writing module configure to write the compressed data blocks and the uncompressed data blocks on the memory storage.

This is beneficial, since the device has a write module and can write the data (i.e. the compressed data blocks and the uncompressed data blocks) on the memory storage.

In an implementation form of the first aspect, the compressed data blocks and the uncompressed data blocks are written on the memory storage based on their corresponding compaction on the output buffer.

This is beneficial, since all the advantages that are provided for the compressed data blocks and the uncompressed data blocks to the output buffer, can be accordingly transferred to the memory storage. In other words, the device enables reducing the stored data size when written to the storage devices. Moreover, when compressed data blocks are read from the storage devices, they are further decompressed to original contents and sizes. Additionally, the device increases the effective storage capacity of the memory storage. The memory storage wear may be decreased, and also its durability may increase, etc.

In an implementation form of the first aspect, the device is further comprising a read module configure to read from the memory storage the compressed data blocks and the uncompressed data blocks.

This is beneficial, since the compressed data blocks and the uncompressed data blocks can be read from the memory storage.

In an implementation form of the first aspect, the read module is further configured to read the compressed data blocks and the uncompressed data blocks based on the identification number of the output buffer, the size of the corresponding block, and the offset of the corresponding block from the beginning of the output buffer.

The chunk ID (hereinafter also referred to chunk identifier, and identification number of the output buffer), the size of the compressed data blocks, and the offset from the beginning of the chunk enables reading the data with a higher speed and more efficiently.

In an implementation form of the first aspect, the memory storage is based on a volatile memory storage or a non-volatile memory storage.

The present disclosure may be applied on the memory storages which are based on the volatile and/or non-volatile systems, without limiting the present disclosure to a specific types of the memory storages.

A second aspect of the present disclosure provides a method for compacting compressed and uncompressed data blocks into an output buffer, wherein the method comprises the steps of, obtaining a set of input data blocks comprising at least one of a compressed data block and an uncompressed data block; compacting the compressed data blocks into the output buffer, starting from a first predefined region in the output buffer, such that the compressed data blocks are sequentially compacted; and compacting the uncompressed data blocks into the output buffer, starting from a second predefined region in the output buffer, such that the uncompressed data blocks are sequentially compacted.

In an implementation form of the second aspect, the method further comprises determining an upper limit in bytes for a compressed data block to be compacted into the output buffer, based on the output buffer size, the size of the compressed data block, and its header size.

In an implementation form of the second aspect, the method further comprises obtaining an input data block, compressing the obtained input data block based on a predefined compression ratio, and determining the size of the compressed data block.

In an implementation form of the second aspect, when it is determined that the size of the compressed data block is less than the grain unit of output buffer, the method further comprises performing a copy-add of the compressed data into a separate output buffer being associated to the compressed data blocks having a size smaller than the grain unit, wherein the grain unit is representative of granularity of a memory storage.

In an implementation form of the second aspect, the first predefined region is the beginning of the output buffer, and wherein the compressed data blocks are sequentially compacted from the beginning of the output buffer growing toward the end of the output buffer.

In an implementation form of the second aspect, the compaction of the compressed data blocks into the output buffer is gapless and/or independent from the grain unit of the output buffer.

In an implementation form of the second aspect, the second predefined region is the end of the output buffer, and wherein the uncompressed data blocks are sequentially compacted from the end of the output buffer growing toward the beginning of the output buffer.

In an implementation form of the second aspect, the compaction of the uncompressed data blocks into the output buffer is arranged based on the grain unit of the output buffer.

In an implementation from the second aspect, the method further comprises calculating a block address for the compressed data block based on determining an offset for the compressed data block in the output buffer, and estimating a length of the compressed data block in the output buffer.

In an implementation form of the second aspect, the block address of a compressed data block having a size less than the grain unit is corresponding to an index of the grain unit.

In an implementation form of the second aspect, the method further comprises calculating a block address for the uncompressed data block based on determining an offset for the uncompressed data block in the output buffer, and estimating a length of the uncompressed data block in output buffer.

In an implementation form of the second aspect, the method further comprises generating a block leading header for each compressed data block, being representative of an offset from the beginning of the grain unit.

In an implementation form of the second aspect, the method further comprises generating a block trailing header for each compressed data block, being representative of an offset of the last byte of the compressed data block from the beginning of the last grain unit of the compressed data block.

In an implementation form of the second aspect, the method further comprises writing the compressed data blocks and the uncompressed data blocks on the memory storage.

In an implementation form of the second aspect, the compressed data blocks and the uncompressed data blocks are written on the memory storage based on their corresponding compaction on the output buffer.

In an implementation form of the second aspect, the method further comprises reading from the memory storage the compressed data blocks and the uncompressed data blocks.

In an implementation form of the second aspect, the method further comprises reading the compressed data blocks and the uncompressed data blocks based on the identification number of the output buffer, the size of the corresponding block, and the offset of the corresponding block from the beginning of the output buffer.

In an implementation form of the second aspect, the memory storage is based on a volatile memory storage or a non-volatile memory storage.

It has to be noted that all devices, elements, units and means described in the present application could be implemented in the software or hardware elements or any kind of combination thereof. All steps which are performed by the various entities described in the present application as well as the functionalities described to be performed by the various entities are intended to mean that the respective entity is adapted to or configured to perform the respective steps and functionalities. Even if, in the following description of specific embodiments, a specific functionality or step to be performed by external entities is not reflected in the description of a specific detailed element of that entity which performs that specific step or functionality, it should be clear for a skilled person that these methods and functionalities can be implemented in respective software or hardware elements, or any kind of combination thereof.

BRIEF DESCRIPTION OF DRAWINGS

The above described aspects and implementation forms of the present disclosure will be explained in the following description of specific embodiments in relation to the enclosed drawings, in which.

DETAILED DESCRIPTION OF EMBODIMENTS

Figure 1:
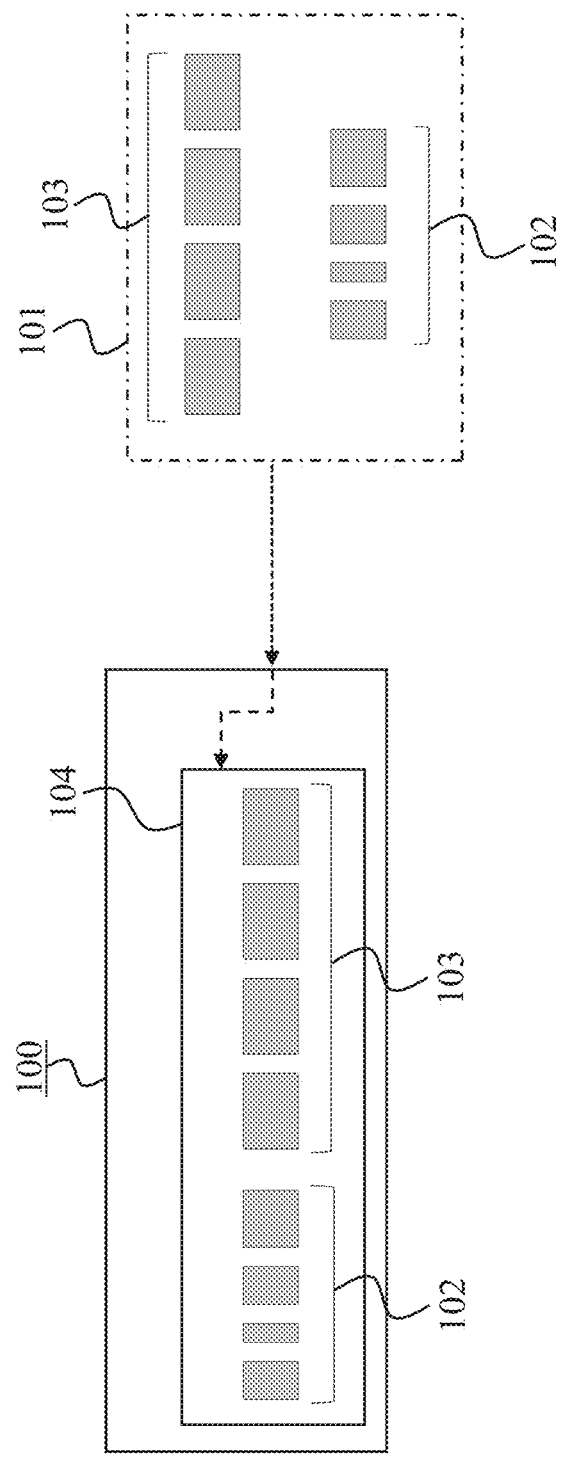
FIG. 1 shows a schematic view of a device for compacting compressed and uncompressed data blocks according to an embodiment of the present disclosure.

FIG. 1 shows a schematic view of a device 100 for compacting compressed and uncompressed data blocks according to an embodiment of the present disclosure. The device 100 is in particular suited to obtain a set of input data blocks 101. The set of input data blocks 101 may include at least one of a compressed data block 102 and an uncompressed data block 103. In the embodiment of FIG. 1, the device 100 obtains a set of input data blocks 101, which includes exemplarily four compressed data blocks 102, and four uncompressed data blocks 103. In some embodiments, the device 100 may further be configured to compress the uncompressed data blocks, the set of obtained input data block, etc.

The device 100 is configured to compact the compressed data blocks 102 into the output buffer 104, starting from a first predefined region in the output buffer 104, such that the compressed data blocks 102 are sequentially compacted.

The device 100 is further configured to compact the uncompressed data blocks 103 into the output buffer 104, starting from a second predefined region in the output buffer 104, such that the uncompressed data blocks 103 are sequentially compacted.

For example, the device 100 may obtain the set of input data block 101. Moreover, the compressed data blocks 102 and the uncompressed data blocks 103 may be compacted differently. The compressed data blocks 102 may be compacted starting from a different region in the output buffer 104 (also referred to as a chunk), than the uncompressed data blocks 103.

The compressed data blocks 102 may be compacted using so-called grain units, e.g., grain unit having fixed sizes of 1 KB and chunks with the fixed size of 1 MB, without limiting the present disclosure to a specific size of the grain unit and/or chunk. Moreover, a block address that combines Chunk ID, grain offset and length for compressed data blocks may be used.

For instance, the compressed data blocks 102 may be compacted from the first predefined region, which may be the beginning of the output buffer 104, and may further grow toward the end of the output buffer 104, and may be sequentially compacted. Furthermore, the compressed data blocks 102 may be compacted without alignment to grain units of the output buffer. This compaction of the compressed data blocks 102 may eliminate wasted space. In some embodiments, however, some wasted space may be formed, for example, when 8 KB is compressed into less than 1 KB.

Moreover, the uncompressed data blocks 103 may be compacted into the output buffer 104, starting from the second predefined region in the output buffer 104, which may be the end of the output buffer 104 and may further grow from the end of the output buffer toward the beginning of the output buffer 104, without limiting the present disclosure to a specific region and/or direction. Also, the uncompressed data blocks 103 may be sequentially compacted.

Moreover, the compaction of the compressed data blocks 102 into the output buffer 104 may effectively eliminate wasted space between adjacent compressed data blocks 102. Similarly, the compaction of the uncompressed data blocks 103 may also eliminate wasted space between adjacent uncompressed data blocks 103. However, some wasted spaced may be formed, for example, when compressed data blocks 102 and uncompressed data blocks 103 are compacted next to each other, e.g., are neighbors.

Figure 2:
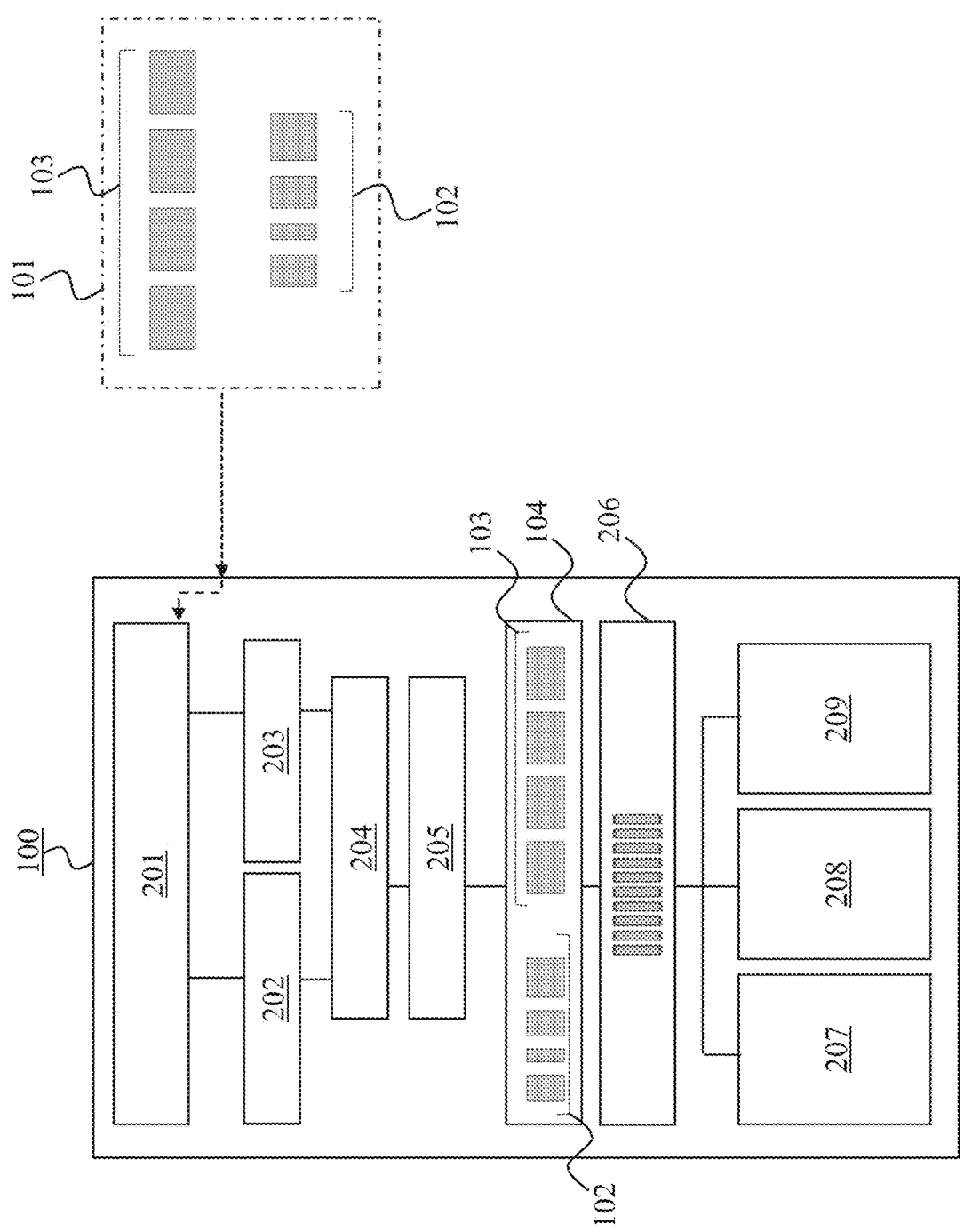
FIG. 2 shows a schematic view of a device for compacting compressed and uncompressed data according to an embodiment of the present disclosure in more detail.

FIG. 2 shows a schematic view of a device 100 for compacting compressed and uncompressed data according to an embodiment of the present disclosure in more detail. The device 100 of FIG. 2 is based on the device 100 of FIG. 1, and therefore includes all of its functions and features. To this end, identical features are labelled with identical reference signs. The additional features that are described in view of FIG. 2 are optional features of device 100.

The device 100 further includes an interface 201 in the form of an adapter, which is configured to be communicatively coupled with another device, for example, a host computer, for obtaining a set of input data blocks 101 comprising at least one of a compressed data block 102 and an uncompressed data block 103. The interface 201 may be based on a computer bus interface, for example, a Serial AT Attachment (SATA), a Parallel Advanced Technology Attachment (PATA), or the like.

The device 100 further includes a data compressor 202, which is configured to compress the input data block 101 obtained by the interface 201, based on a predefined compression ratio, and determine the size of the compressed data block 102. For example, the data compressor 202 may utilize various compression schemes to remove, e.g., redundant data, meta-data and/or reduce the size of the obtained input data blocks 101.

Moreover, the device 100, for example, its data compressor 202, may further be configured to determine an upper limit in bytes for the compressed data block 102 to be compacted into the output buffer 104, based on the output buffer size, the size of the compressed data block, and its header size.

Moreover, the device 100 may further optionally comprise a data compactor 203. The data compactor 203 may obtain the information related to, e.g., the size of the compressed data block, the header size, the output buffer size, etc., and may further perform a compaction of the compressed data blocks 102 and the uncompressed data blocks 103 into the output buffer 104.

The device 100 may further optionally comprise a block address calculator 204. The block address calculator 204 may calculate a block address for the compressed data block 102 based on determining an offset for the compressed data block 102 in the output buffer 104, and estimating a length of the compressed data block 102 in the output buffer 104.

As discussed, the data compressor 202 may determine the size of the compressed data block 102. Moreover, when it is determined that the size compressed data block 102 is less than the grain unit of the output buffer 104, the block address calculator 204 may assign an index of the grain unit as the block address of the compressed data block with the size less than the grain unit.

The block address calculator 204 may further calculate a block address for the uncompressed data block 103 based on determining an offset for the uncompressed data block 103 in the output buffer 104, and estimating a length of the uncompressed data block 103 in output buffer 104.

As discussed, the length bits in block address may be estimated. For example, the device 100 (e.g., its block address calculator 204) may assign the bit pattern "111" to the uncompressed data occupying 8 grain units. Moreover, other bit patterns, from "000" to "110" (encoding numbers from 0 to 6) may be used for compressed data block's length. The compressed data block's length may be calculated by adding 2 to the value represented by a bit pattern. For example, the bit pattern "000" represents the value of 0. Then, by adding 2 to its 0 value (i.e. 0+2=2) the present disclosure encodes a length of 2 grain units for the compressed data blocks. Therefore, the lengths of the compressed data blocks may be expressed in grain units, to be in the range of 2 to 8.

In addition, a compressed data length of 8, which is encoded by bit pattern of "110" is for actual length of the compressed data block being less than 8 KB (i.e. <8 KB), and it is rounded to 8 grain units. Therefore, it is possible to have compressed data blocks with the sizes up to, e.g., 8 KB-256 bytes. A reason to have this value as upper bound for compressed data's size is that, for example, if all blocks are compressed to 8 KB-256, and further packed into the chunk without alignment, then it may be possible to have 129 compressed data blocks in one chunk, which is one block more than 128 uncompressed data blocks. In some embodiments, the present disclosure may require 1 bit per block to be used for garbage collection, rather than 1 bit per grain unit in the conventional devices.

The device 100 may further optionally comprise a block header generator 205. The block header generator 205 may further be configured to generate a block leading header for each compressed data block 102, being representative of an offset from the beginning of the grain unit. Moreover, the block header generator 205 may further generate a block trailing header for each compressed data block 102, being representative of an offset of the last byte of the compressed data block from the beginning of the last grain unit of the compressed data block.

As discussed, the data compressor 203 may perform a compaction of the compressed data blocks 102 and the uncompressed data blocks 103. The data compactor may compact the compressed data blocks 102 into the output buffer 104, starting from a first predefined region in the output buffer 104. The first predefined region may be the beginning of the output buffer 104, and the compressed data blocks 102 may be sequentially compacted from the beginning of the output buffer 104 growing toward the end of the output buffer 104. Moreover, the compaction of the compressed data blocks 102 into the output buffer 104 may be gapless and/or independent from the grain unit of the output buffer 104. In other words, it may be without alignment to grain units of the output buffer 104. This packing may eliminate the waste space, or the like.

The data compactor may further perform a compaction of the uncompressed data blocks 103 into the output buffer 104, starting from the second predefined region. The second predefined region may be the end of the output buffer 104, and the uncompressed data blocks 103 may be sequentially compacted from the end of the output buffer 104 growing toward the beginning of the output buffer 104. Furthermore, the compaction of the uncompressed data blocks 103 into the output buffer 104 may be arranged based on the grain unit of the output buffer 104. For example, the uncompressed data blocks 103 may be packed into output buffer such that they are naturally aligned to 1 KB (i.e. a size of overall 8 KB).

The device 100 may further optionally comprise a separate output buffer 206. The separate output buffer 206 may be used for the compaction of the compressed data blocks which have a small size, e.g., less than the grain unit of the output buffer 104. As discussed, the data compressor 202 may determine the size of the compressed data blocks. Moreover, wherein when it is determined that the size of the compressed data block is less than the grain unit of output buffer 104, the device (e.g., the data compactor 203) may perform a copy-add of the compressed data into a separate output buffer 206 being associated to the compressed data blocks having a size smaller than the grain unit, wherein the grain unit is representative of granularity of a memory storage 208 and/or the output buffer 104.

The device 100 may further optionally comprise a memory storage 208. The memory storage 208 may be based on e.g., a volatile memory storage, a non-volatile memory storage, etc.

The device 100 may further optionally comprise writing module 207. The writing module may be configured to write the compressed data blocks 102 and the uncompressed data blocks 103 on the memory storage 208. Moreover, the compressed data blocks 102 and the uncompressed data blocks 103 are written on the memory storage 208 based on their corresponding compaction on the output buffer 104 (and/or the separate output buffer 206).

The device 100 may further optionally comprise read module 209. The read module 209 may be configured to read from the memory storage 208 the compressed data blocks 102 and the uncompressed data blocks 103. Moreover, the read module 209 may be configured to read the compressed data blocks 102 and the uncompressed data blocks 103 based on the identification number of the output buffer, the size of the corresponding block, and the offset of the corresponding block from the beginning of the output buffer.

Figure 3:
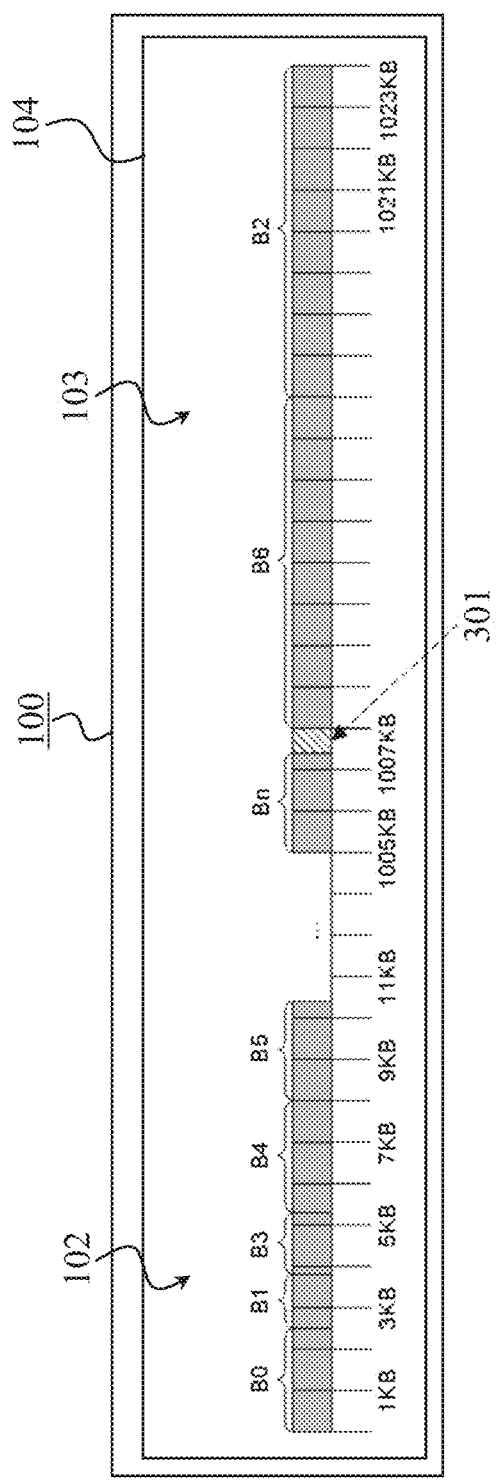
FIG. 3 schematically illustrates compacting compressed and uncompressed data blocks into 1 MB chunk according to various embodiments.

FIG. 3 schematically illustrates compacting compressed 102 and uncompressed data blocks 103 into 1 MB chunk 104 (i.e. an output buffer) according to various embodiments. Without limiting the present disclosure, in the following, a chunk 104 of 1 MB is used for compacting of compressed 102 and uncompressed data blocks 103 into the chunk 104.

The device 100 obtains a set of input data blocks comprising compressed data blocks 102 including B0, B1, B3, B4, B5 and Bn, and uncompressed data blocks 103 including B2 and B6 to be compacted into the chunk 104.

The compressed data blocks 102 (i.e. B0, B1, B3, B4, B5 and Bn) are grouped together at the beginning of the chunk 104. They are packed starting from the left (i.e. beginning of the chunk) and grow towards the end of the chunk 104. The compressed data blocks 102 are packed without any alignment, hence there is no waste space between any two adjacent compressed data blocks 102.

Furthermore, the uncompressed data blocks 103, for example, having the size of 8 KB, 16 KB (and/or 32 KB) blocks, are grouped together at the end of the chunk 104. The uncompressed data blocks 103 are packed starting from the right (i.e. end of the chunk) and grow towards the beginning of the chunk 104. The uncompressed data blocks 103 are packed with natural alignment by block size, e.g. by 8 KB.

There might be (e.g. small amount of) a wasted space 301 between the compressed data blocks 102 and the uncompressed blocks 103, for example, when chunk 104 is full and the compressed data block 102 are in adjacent of uncompressed data block 103, etc.

In the embodiment of FIG. 3 the formed wasted space 301 is between Bn and B6. The waste space occurs when it is not possible to add another compressed or uncompressed data block. The waste space size in this case may be in range from 1 byte up-to (8 KB-1 byte).

Figure 4:
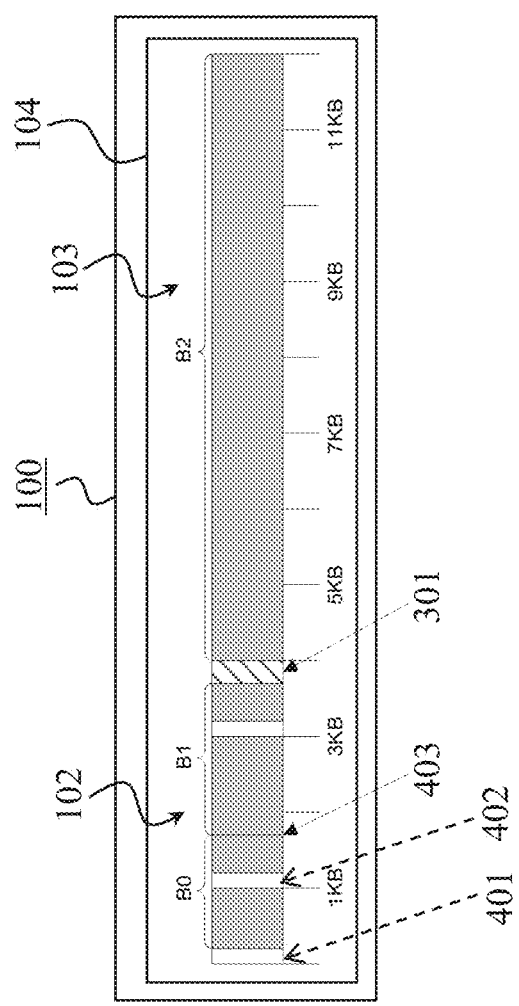
FIG. 4 schematically illustrates calculating a block address and a block header according to various embodiments.

FIG. 4 schematically illustrates calculating a block address and a block header 401 according to various embodiments.

As discussed, one or more of several kinds of metadata may be used including a block address, a leading header 401 and a trailing header 402 (shown as white rectangles) for the compressed data block.

The block address may, for example, combine the chunk ID, the block offset (e.g., an offset relative to the chunk start), and the block length. Moreover, the block offset and the block length may be expressed in grain units.

The block addresses may occupy 64 bits. Moreover, the block addresses may be kept in RAM (read access memory) for faster access to blocks written to storage media, e.g. to a solid state device (SSD).

The leading header 401 for the compressed data blocks may include, for example, the block offset in bytes for the compressed data blocks relative to the beginning of the grain unit. The leading header 401 for compressed data block may be stored at the beginning of the first grain unit of the compressed data block 102 in the chunk 104. The first grain unit of compressed data block may be at the offset in respective block address. The relationship of block address and block header is shown in FIG. 4, in which the positions of block headers are marked as white rectangles. Moreover, the 403 indicates an actual start position by header.

The trailing header 402 for the compressed data blocks may include, for example, the (e.g. proper) trailing when the compressed data block 102 is the last compacted block. However, if the compressed data block 102 is compacted such that there is another compressed data block compacted next to it, e.g., there is a next compressed data block, then the trailing header 402 for the previous compressed data block may be and/or may represent the leading header for the next compressed data block.

Each compressed data block 102 may have one leading header 401 and one trailing header 402. The leading header 401 determines offset of first byte of compressed data block 102, and the trailing header 402 determines offset of byte following the last byte of compressed data block.

In FIG. 4, the block B0 has its leading header 401 at the first grain unit, and further has its trailing header 402 at the second grain unit.

The uncompressed data block may only have the block address. Moreover, the uncompressed data blocks may not have a header, e.g., the leading header and/or the trailing header.

Figure 5:
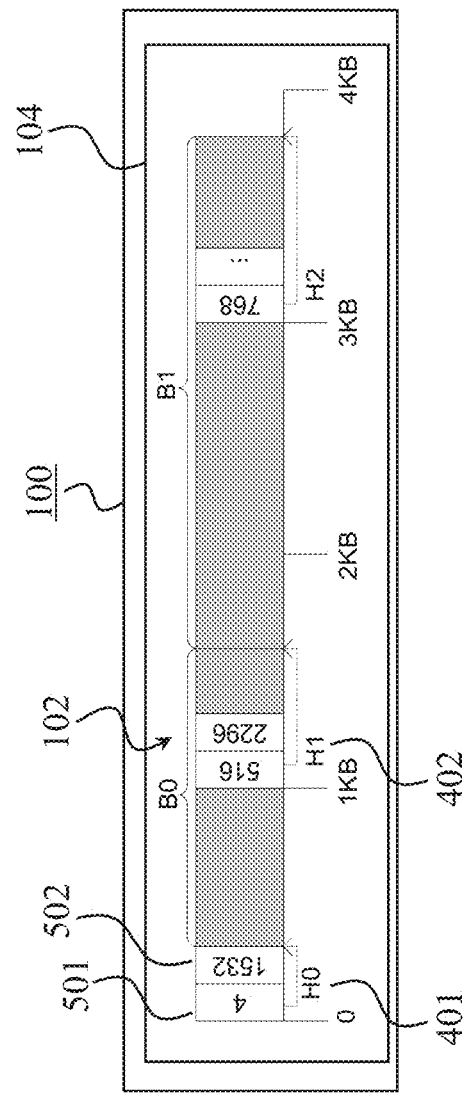
FIG. 5 schematically illustrates an example of block headers according to various embodiments.

FIG. 5 schematically illustrates an example of block headers according to various embodiments. The block headers are used for compressed data only.

In FIG. 5, H0 and H1 are leading 401 and trailing headers 402 of block B0, respectively. H1 and H2 are leading 401 and trailing headers 402 of block B1, respectively.

H0 offset 501 field contains value 4 in bytes to point to B0 block actual start in the grain unit. H0 size 502 field contains value 1532 in bytes, B0 block compressed size as reported, e.g., by data compressor.

H1 offset field contains 516 bytes offset to point to B1 block start in the grain unit. H1 size field contains value 2296 in bytes for compressed size of B1 block, etc.

Figure 6:
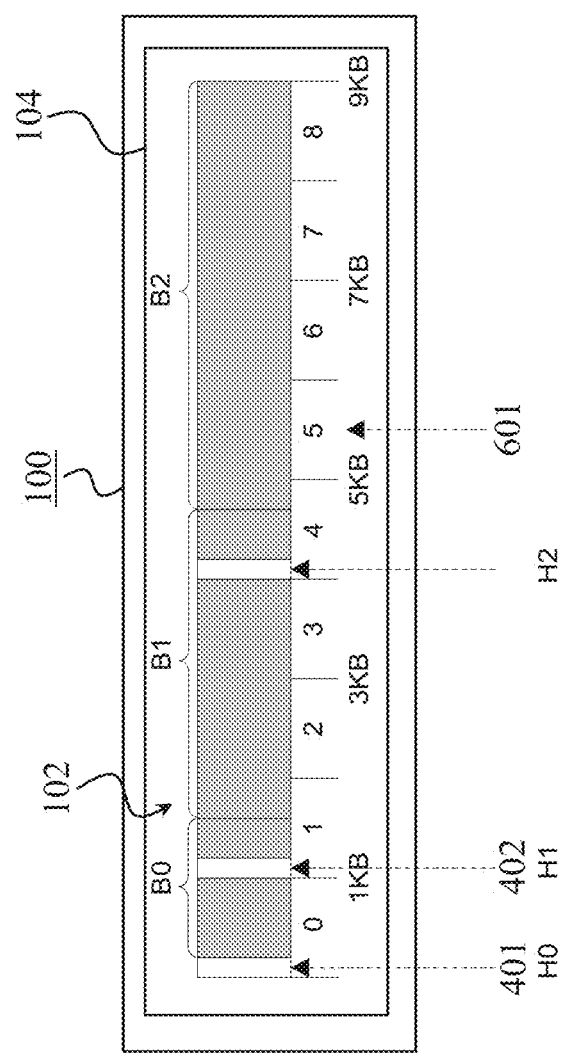
FIG. 6 schematically illustrates calculating a block length according to various embodiments.

FIG. 6 schematically illustrates calculating a block length according to various embodiments.

The size of the compressed block data (also referred to as length) may be measured in bytes and/or in grain units.

The present disclosure does not require compressed data blocks 102 to be aligned, so the compressed data blocks 102 may start anywhere in a grain unit 601, span one or more grain unit 601, and may further end anywhere in the grain unit 601.

FIG. 6 illustrates three compressed blocks 102 including blocks B0, B1, and B2 with corresponding headers 401, 402, also (H0, H1, H2). The block B0 spans grain units 0 and 1. The Block B1 spans grain units 1, 2, 3, and 4 (the last one has trailing header for B1). Block B2 spans grain units of 4 to 9 (the last grain unit (not shown) contains trailing header for B2).

The present disclosure defines the sizes of the compressed data blocks in grain units in the ranges from 2 to 8. Moreover, the present disclosure allows the sizes of the compressed data blocks 102 in bytes up to 8 KB-256, which can also be expressed in grain units of 8.

Figure 7:
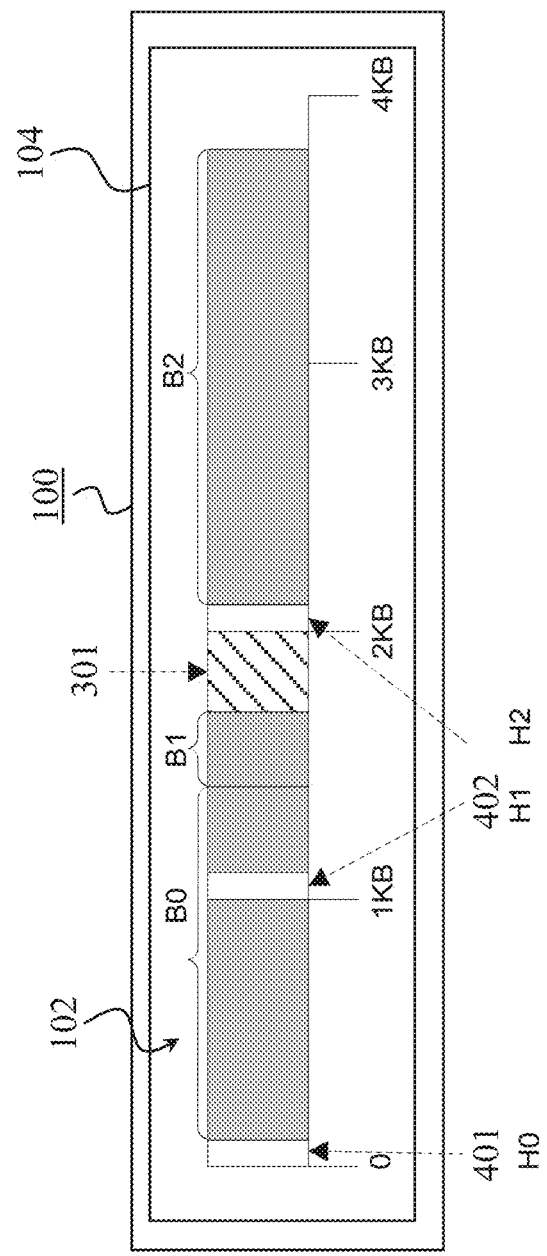
FIG. 7 schematically illustrates formation of a wasted space between two compressed data blocks according to various embodiments.

FIG. 7 schematically illustrates formation of a wasted space 301 between two compressed data blocks 102 according to various embodiments.

A wasted spaced 301 may occur between two compressed blocks 102, for example, when the size of the (e.g., at least one) compressed data block 102 is less than one grain unit (e.g., less than 1 KB). In the embodiment of FIG. 7, the wasted space 301 is formed between block B1 and block B2.

Moreover, a wasted space 301 may occur, for example, under the following three conditions:
1. The last part of the compressed block B0 is smaller than 1 KB, and
2. CR is very high so that next block B1 is compressed into less than 1 KB, and
3. B0 last part together with whole block B1 fit into the same unit, so there may be waste space left in that unit (block B2 with corresponding header will start from the next unit).

Figure 8:
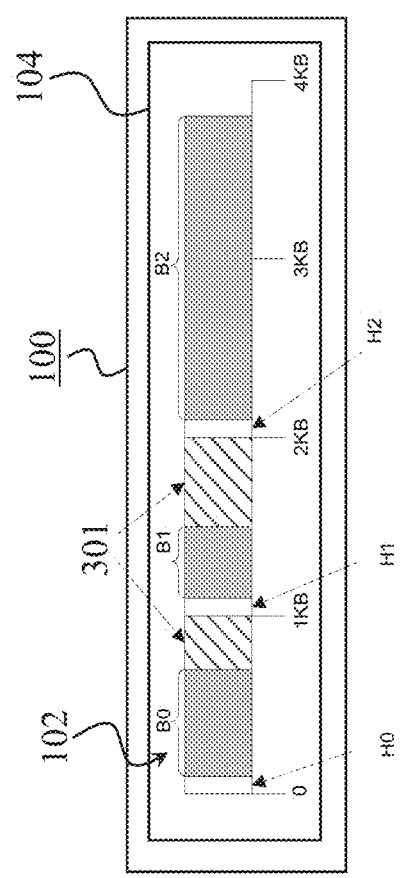
FIG. 8 schematically illustrates formation of two wasted spaces between three compressed data blocks according to various embodiments.

FIG. 8 schematically illustrates formation of two wasted spaces 301 between three compressed data blocks 102 according to various embodiments.

FIG. 8 illustrates formation of a wasted space 301, which occurs when the compression ratio (CR) is very high, for example, CR=9:1. In some embodiments, each of two consecutive blocks may be compressed into less than 1 KB and a wasted space 301 may be formed. In the embodiment of FIG. 8, the block B1 with corresponding header starts from the next grain unit, therefore, a wasted space 301 is formed between the two consecutive grain units.

Figure 9:
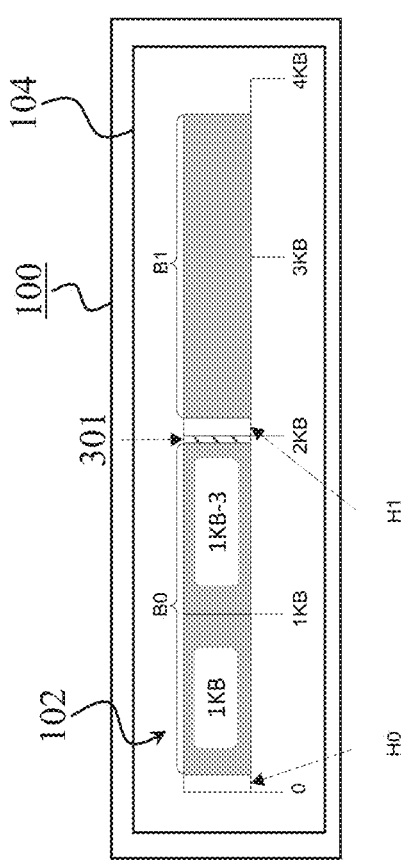
FIG. 9 schematically illustrates formation of a wasted space between two compressed data blocks according to various embodiments.

FIG. 9 schematically illustrates formation of a wasted space 301 between two compressed data blocks 102 according to various embodiments.

FIG. 9 illustrates formation of a wasted space 301 which is formed, for example, when there is not enough bytes in the last grain unit of the compressed block for the trailing header.

For instance, with an assumption that the block header takes 4 bytes. The last part of the compressed data block B0 has a size bigger than 1020 and less than 1024 bytes. Therefore, a wasted space 301 is formed here which is in the ranges from 1 to 3 bytes. Moreover, the last grain unit header is placed to the next grain unit, and the size of the compressed data block 102 increases by one grain unit. Furthermore, the next compressed data block of B1 may be absent, therefore, the last grain unit contains only the trailing header. In such a case, the formed wasted space is 1020 bytes plus (1 to 3) bytes from the previous grain unit. This may occur only for every chunk 104.

Figure 10:
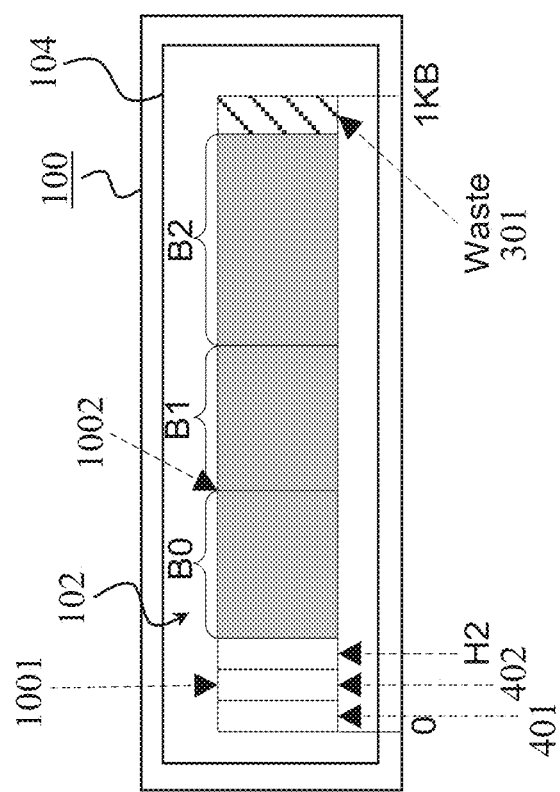
FIG. 10 schematically illustrates placement of headers for several compressed data blocks of small size blocks according to various embodiment.

FIG. 10 schematically illustrates placement of headers 401, 402 for several compressed data blocks 102 of small size, according to various embodiments.

In some embodiments, several headers (e.g., two or more) may be grouped together and may further be placed before respective blocks. Moreover, it may be possible to further eliminate and/or decrease the wasted space.

In FIG. 10 the headers 401, 402 for several compressed data blocks 102 of small size, are placed together in the beginning of the output buffer 104. Moreover, 1001 indicates the start unit by chunk ID and offset, getting the block header by index, and 1002 indicates block actual start position in unit which is indicated by header, as discussed above.

Figure 11:
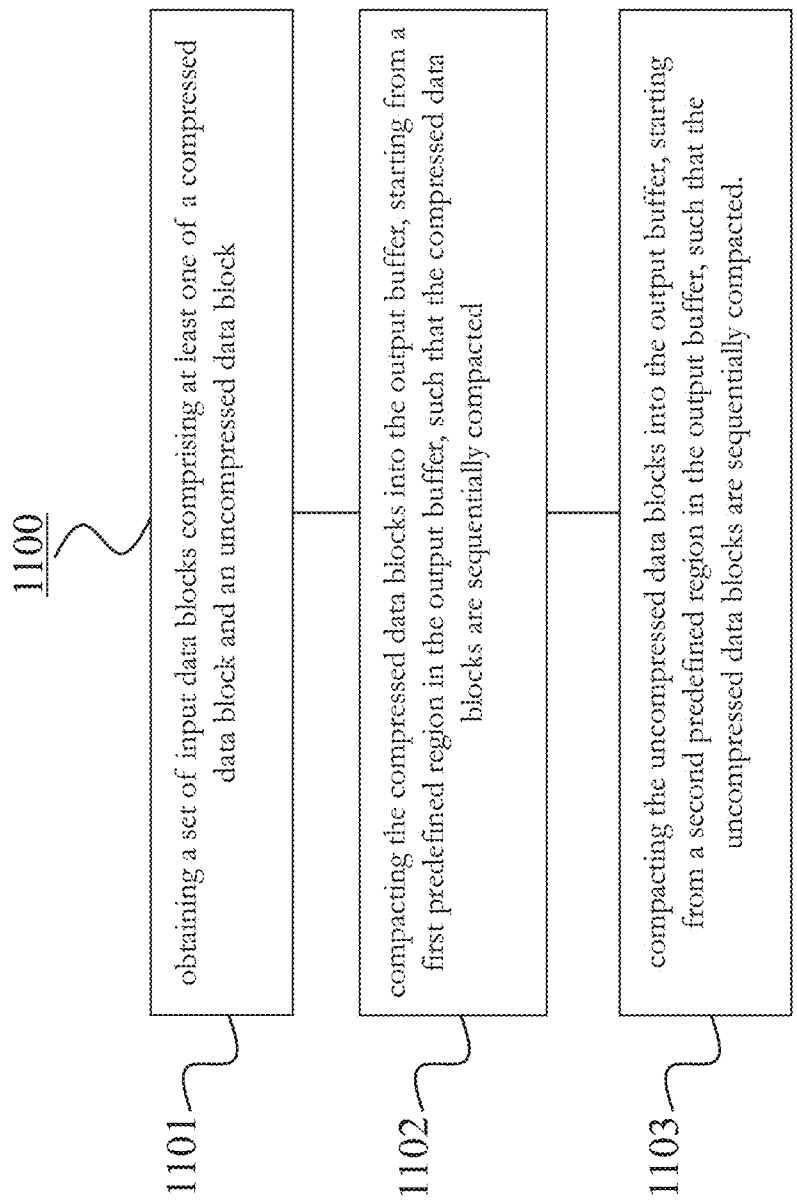
FIG. 11 shows a schematic view of a method for compacting compressed and uncompressed data blocks into an output buffer according to an embodiment of the present disclosure.

FIG. 11 shows a schematic view of a method 1100 for compacting compressed 102 and uncompressed data blocks 103 into an output buffer 104 according to an embodiment of the present disclosure.

The method 1100 comprises a first step of, obtaining 1101 a set of input data blocks 101 comprising at least one of a compressed data block 102 and an uncompressed data block 103.

The method 1100 further comprises a second step of, compacting 1102 the compressed data blocks 102 into the output buffer 104, starting from a first predefined region in the output buffer 104, such that the compressed data blocks 102 are sequentially compacted.

The method 1100 further comprises a third step of, compacting 1103 the uncompressed data blocks 103 into the output buffer 104, starting from a second predefined region in the output buffer 104, such that the uncompressed data blocks 103 are sequentially compacted.

Figure 12:
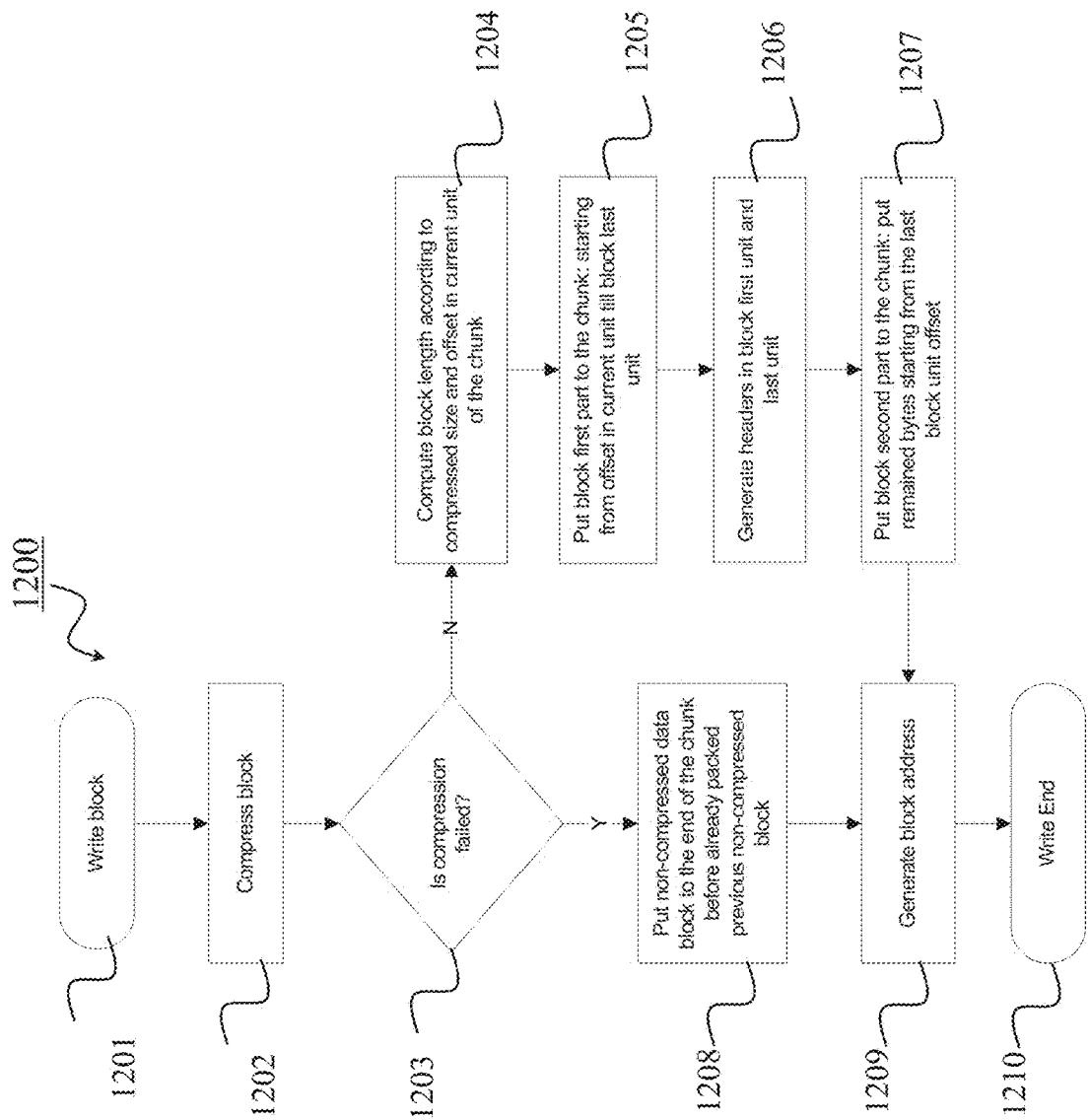
FIG. 12 shows a schematic view of a method for writing input data blocks on a memory storage according to according to various embodiments.

FIG. 12 shows a schematic view of a method 1200 for writing input data blocks on a memory storage according to various embodiments.

At 1201, the device 100 obtains an input data block and start writing the obtained input data block into a memory storage.

At 1202, the device 100 compresses the obtained input data block based on a predefined compression ratio.

At 1203, the device 100 determines if the input data block is compressible or not. Moreover, when it is determined that the input data block is compressible, the devices 100 further determines the size of the compressed data block, and proceeds to step 1204. However, when it is determined that the input data block is not compressible (i.e. the compression is failed), the device 100 proceeds to step 1208.

At 1204, the device 100 computes block length according to compressed size and offset in current unit of the chunk.

Moreover, the device determines an upper limit for the compressed block size, based on [output Buffer Size/(1+ output Buffer Size/input Block Size)−2×header Size]. For example, for an output buffer of 1 MB, and input block of 8 KB, and a header Size of 4, the device determines an upper limit of 8120 bytes. In the above formula; the header size is multiplied by 2, because of the leading and trailing headers for each compressed block.

Furthermore, the device 100 adjusts the upper limit with the number of bytes in the last grain unit occupied by previous compressed data block, so that the following compressed data block length in grain units should be less than or equal to the length-bit (i.e. 1<length Bits). For the case of length Bits of 3, the length of the compressed data block in grain units would be 8 (i.e. less or equal 1<3).

For example, assuming that the last grain unit of previous compressed data block (together with its trailing header) is occupied by 15 bytes. The device 100 adjusts the upper limit by subtracting 15 to have overall limit for the size of the compressed data block in grain units equal to or less than grain units (1<length Bits).

Moreover, the device 100 compares the adjusted upper limit to the free space left in the output buffer. When it is determined that, there is enough free space, the device 100 proceeds with the adjusted upper limit. Otherwise, the device 100 replaces the value of the upper limit by the size of free space left in the output buffer and proceeds to the step 1205.

At 1205, the device 100 puts the blocks first part to the chunk, starting from offset in the current unit till the block last unit.

The device 100 stores the compressed data block in the output buffer growing from the start adding the leading and the trailing headers (to be generated and added at 1206). For instance, the device 100 increments the current pointer for the compressed data blocks by the size of the compressed data block, and by adding the leading and the trailing headers, in order to write the next uncompressed data block.

Moreover, when the size of the compressed data block is less than one grain unit, then the device performs a copy-add of the compressed data block to the separate buffer for small compressed data blocks, as discussed above.

In addition, when the separate buffer is full, e.g., it contains two or more small compressed data blocks, the device 100 flushes its content (i.e. the content of the separate buffer) to the output buffer, and proceeds to the step 1209 for calculating the block addresses of the compressed data blocks.

At 1206, the device 100 generates headers in the block first unit and the last unit.

Moreover, the device 100 writes the leading header for the compressed data blocks, for example, when the first grain unit to store the compressed data blocks is empty. The leading header contains the actual start position of the compressed data blocks, as discussed above. For instance, for a header size of 4 bytes, the actual start position of the compressed data blocks is 4.

As discussed above, the device 100 writes the compressed data blocks in all of the grain units but the last one to the output buffer. In the last grain unit, the device 100, initially writes the trailing header. The trailing header contains the actual start position of the free space that follows the compressed data block. The trailing header may be the leading header for the next compressed data block.

In addition, the last grain unit for the compressed data block may contain the trailing header, and zero or more bytes of the compressed data block. Furthermore, it may happen that, the size of the compressed data block to be written in the last grain unit, does not allow writing the trailing header. For example, when the size of the grain unit is 1024 bytes, the header size is 4 bytes, and the size of the compressed data block to be written in the last grain unit is 1021, or 1022, or 1023 bytes. In such a case, the compressed data block may be added with 0-bytes up to the size of the grain unit. Moreover, the trailing header may be written at the beginning of the next grain unit.

At 1207, the device 100 puts the block second part to the chunk, the device 100 puts remained bytes starting from the last block unit offset.

In addition, the device 100 may further write zero or more bytes of the compressed data block in the last grain unit.

At 1208, the device 100 puts the uncompressed data block to the end of the chunk before already packed previous uncompressed data block.

For example, the device 100 determines that the compression is failed, e.g., the size of the block is bigger than or equal to the adjusted upper limit. Moreover, the device 100 stores the original block (i.e. being an uncompressed data block) in the output buffer growing from the end toward the beginning. In addition, the device 100 decrements the current pointer for the uncompressed data blocks by the original block size, in order to prepare for writing the uncompressed data blocks.

Moreover, when there is not enough free space in the output buffer to store the uncompressed data block, the device 100 flushes the output buffer, initializes all data, and further stores the uncompressed data block in a newly initialized output buffer.

Alternatively, if the flushing of the output buffer happens, for example, due to replacing the value of the upper limit by the size of the free space, as described above. Then, the device 100 flushes the output buffer, initializes all data, and further compresses the input data block again.

At 1209, the device 100 generates the block address.

At 1210, the device 100 writes the block and ends the writing of the block to the memory storage.

The device 100 calculates the block address for the compressed and/or the uncompressed data block, as discussed above.

The block address contains the bit-fields such as the offset, the length, etc., and are calculated as follow.

The device 100 calculates the offset of the compressed or the uncompressed data block in the output buffer. For example, if the output buffer size is 1 MB and the size of the uncompressed data block is 8 KB, then the device 100 stores 128 uncompressed data blocks in the output buffer. Moreover, the device 100 allocates at least two grain units for each compressed data block, since two headers for each of the compressed data blocks are required. Hence, the device 100 may store 512 compressed data blocks in the output buffer. The device 100 further encodes the offset for any of 512 compressed data blocks by using 9 bits. This is 1 bit less than 10 bits that the device 100 uses for the 1 KB grain unit as the minimal addressable entity for the offset.

Moreover, the device 100 calculates the length of the compressed and/or uncompressed data blocks in the output buffer. For example, when the output buffer is 1 MB, the data blocks are 8 KB, and 1 KB grain units. The device 100 requires 3 bits for the length. As discussed above, the bit value of 111 represents the uncompressed data block with a length equal to 8 grain units or 8 KB. Moreover, a bit values in the ranges of 000 to 011 represents the size of the compressed data blocks with a lengths in the ranges from 2 to 8 grain units or 2 KB to 8 KB.

In the case of the separate output buffer, the device 100 uses an index of the small compressed data block in one grain unit. For example, an output buffer with a size of 1 MB, data blocks with sizes of 8 KB, 1 KB grain units, and 3 small blocks per grain unit. The device 100 requires 2 bits for the index. The index value of 0 (bit field value 00) means that there is no small compressed data blocks.

Furthermore, the block address for the uncompressed data block contains the actual offset of the original block in the chunk, and length equal to [(1<<length Bits)−1]. For example, for the case of length Bits of 3, the block address length of the uncompressed data block is 7 (i.e. (1<3)−1=7). However, the original length in grain units is 8 (i.e. (1<3) =8). Moreover, the block address may contain the index of the small compressed data blocks in one grain unit, as discussed above. The index values in the ranges of 1 to 3 are for small compressed data blocks of 1 to 3, respectively.

In addition, the compressed data block offset for its block address is the offset of the first grain unit that the compressed data block occupies. Moreover, when the compressed block data occupies one grain unit or less, the device 100 forces the length to be at least 2, due to the need of leading and trailing headers.

Furthermore, the length of the compressed data block used in block address is the total number of the grain units occupied by the compressed block data minus 2, and by considering the adjusted upper limit for the size of the compressed data block. When, the device 100 determines that the difference between the current pointer for the uncompressed data block and the compressed data blocks is at least two grain units, the device 100 considers the next input data block. Otherwise, the device 100 flushes the output buffer, and initializes all data.

Figure 13:
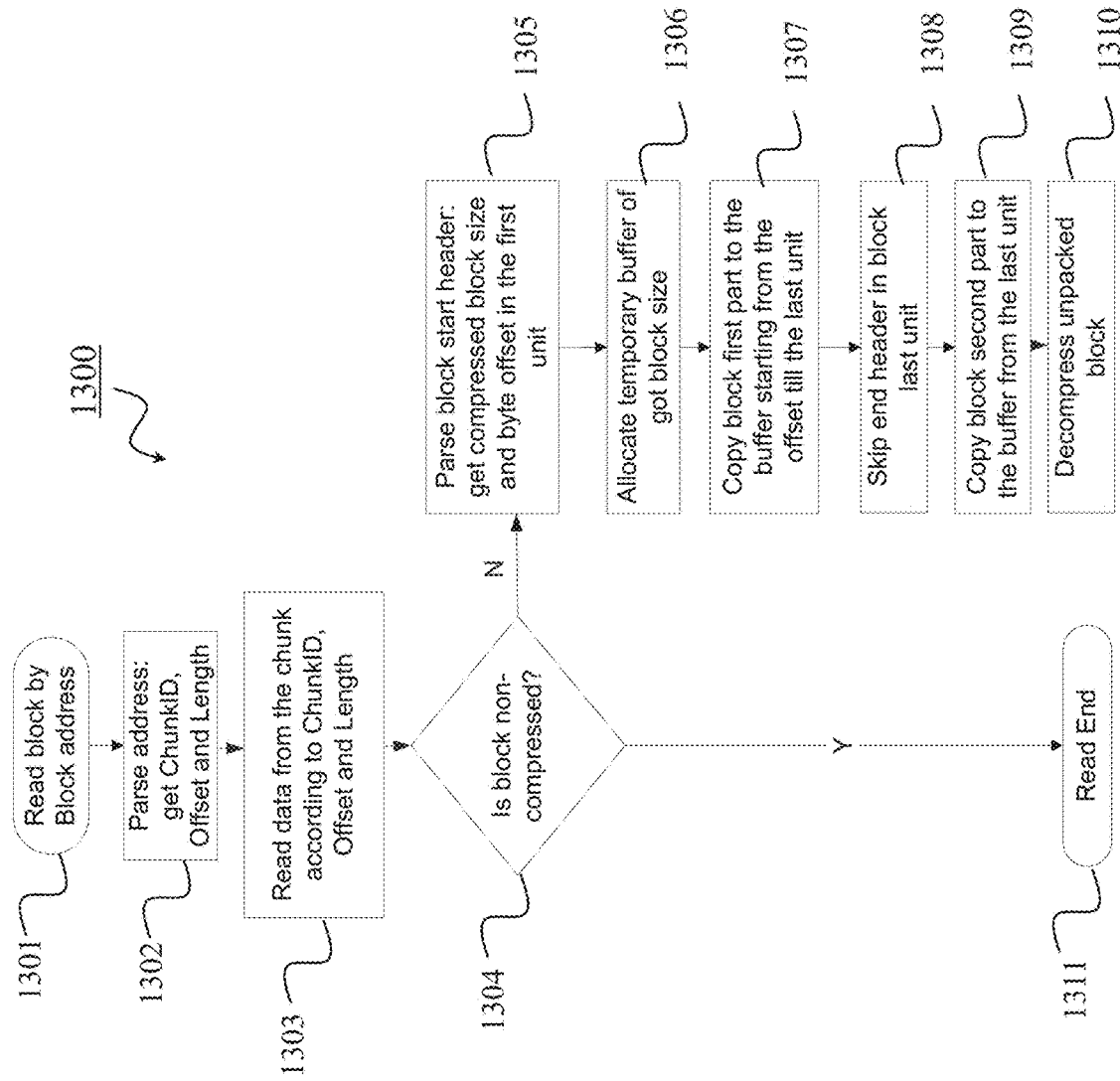
FIG. 13 shows a schematic view of a method for reading compressed and uncompressed data blocks from a memory storage according to various embodiments.
Figure 14:
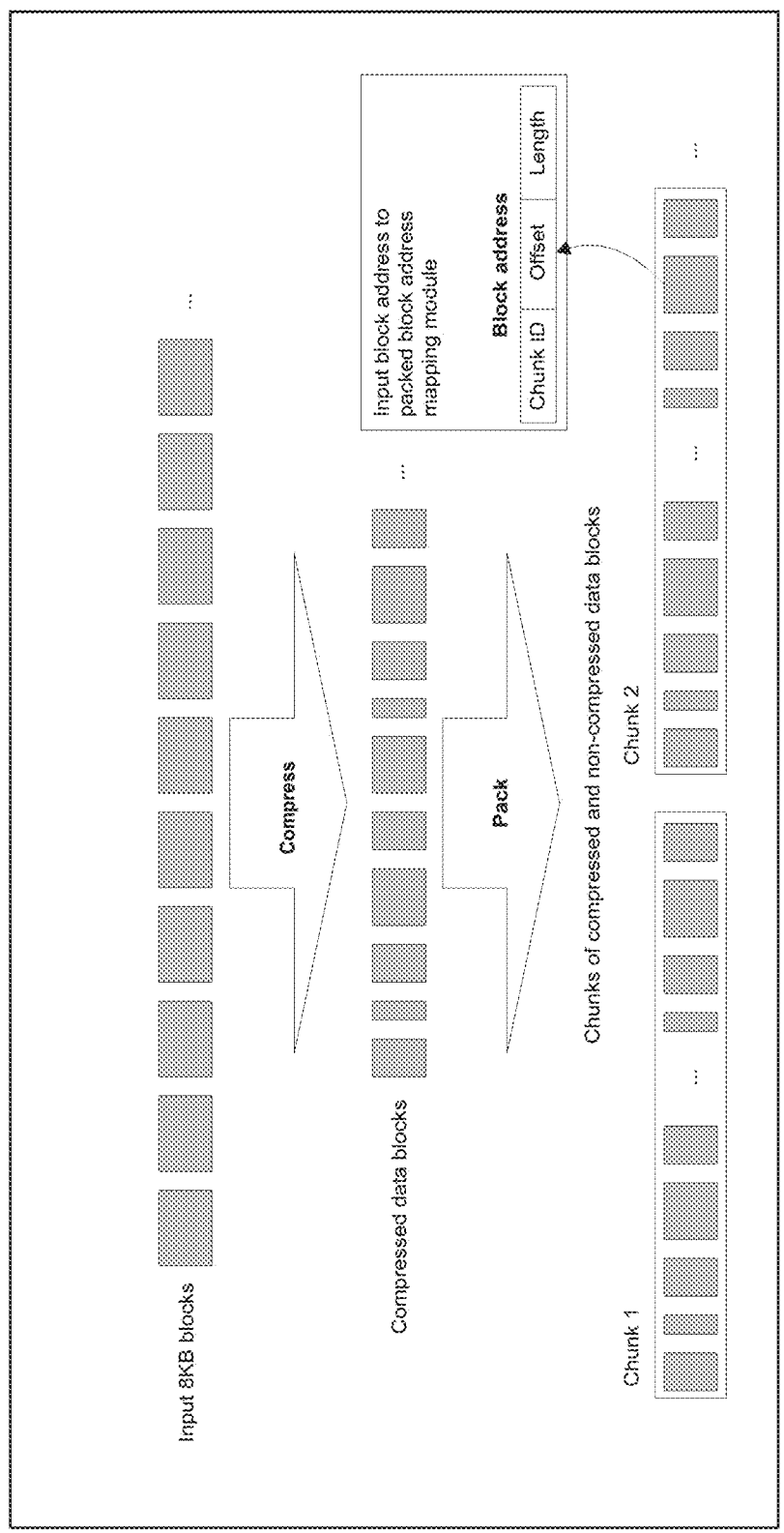
FIG. 14 shows a schematic view of conventional compression and packing into chunks with packing by 1 KB grain unit alignment.
Figure 15:
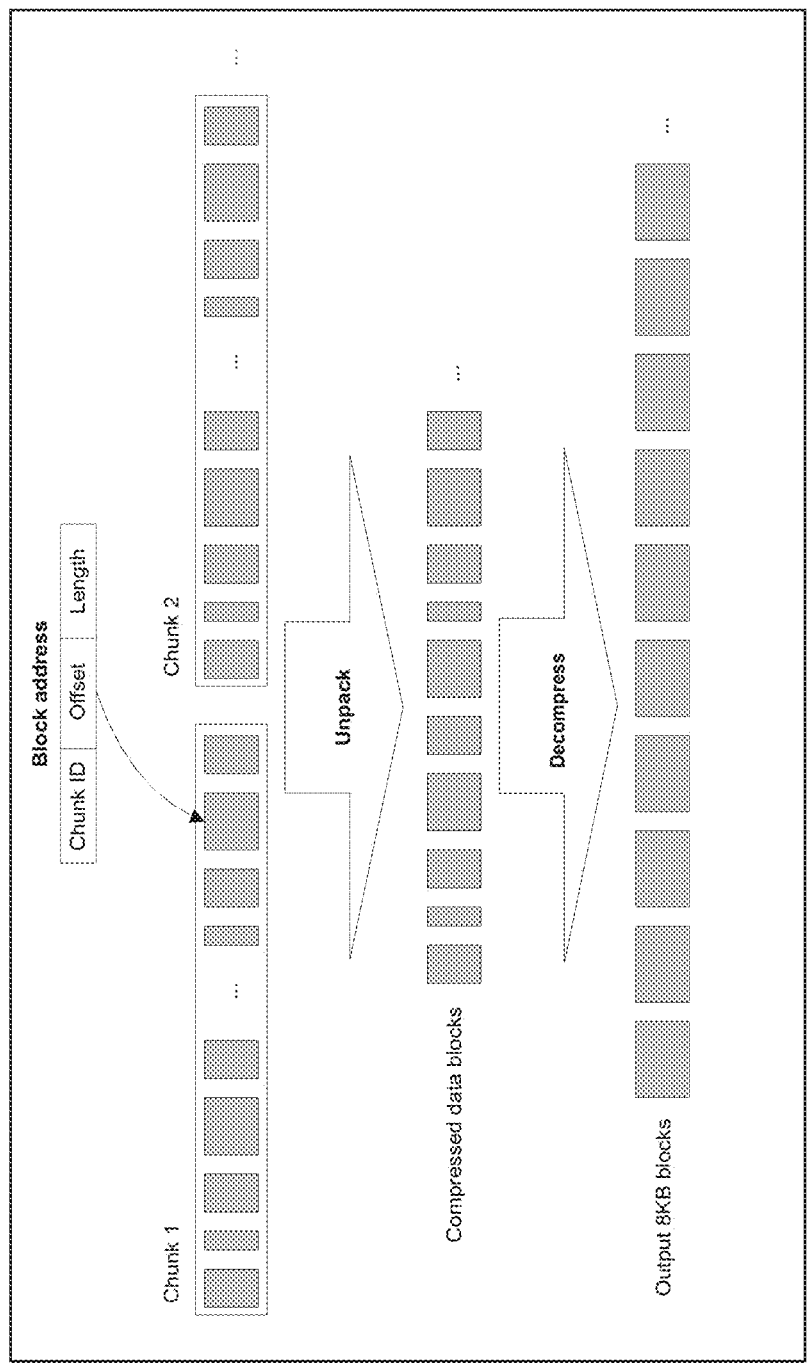
FIG. 15 shows a schematic view of conventional unpacking and decompression from chunks with packing by 1 KB grain unit alignment.
Figure 16:
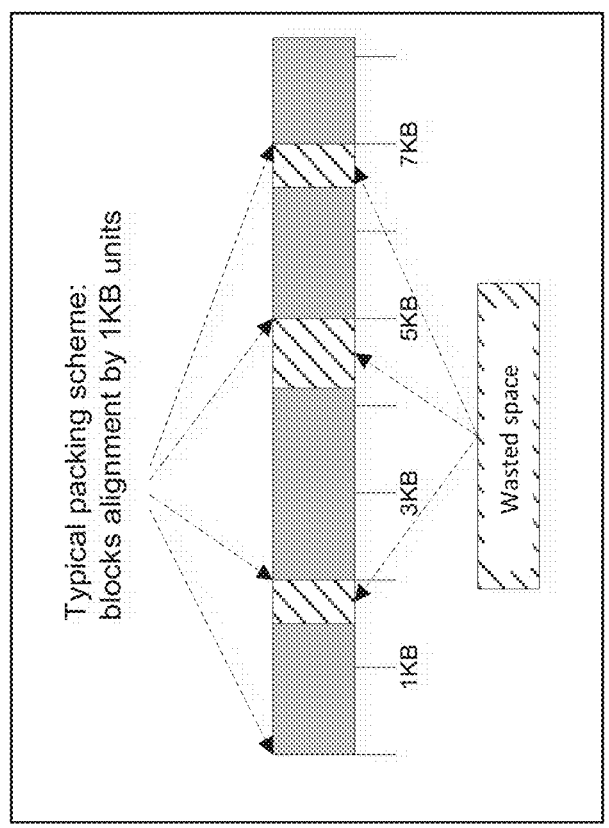
FIG. 16 shows a schematic view of wasted space in grain units when compressed data blocks being packing by 1 KB grain unit alignment.
Figure 17:
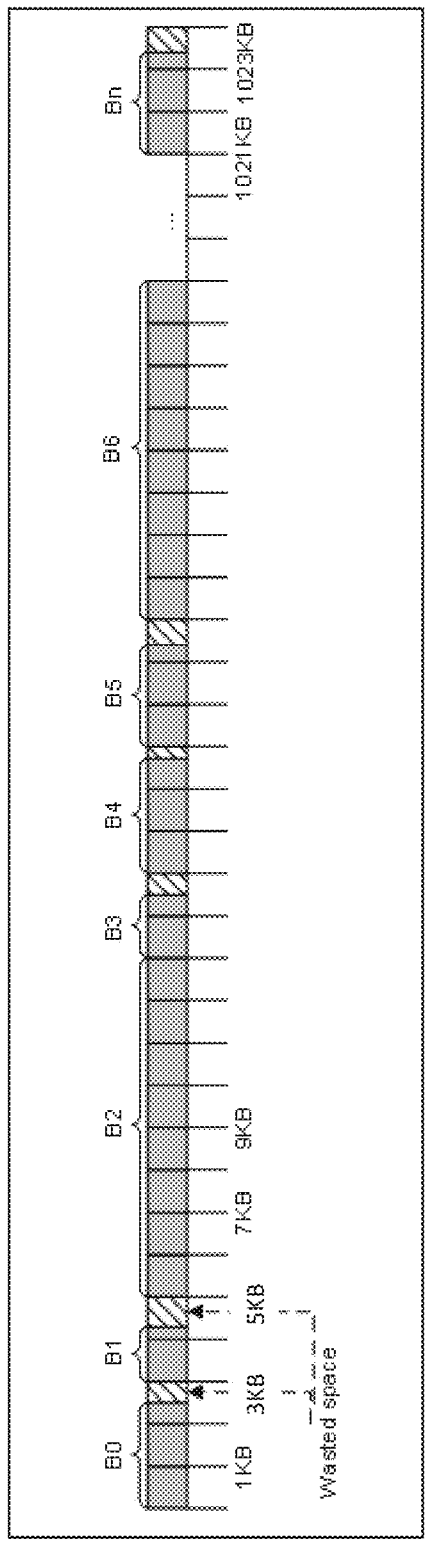
FIG. 17 shows a schematic view of wasted space in grain units when compressed and uncompressed data blocks being packing by 1 KB grain unit alignment.
Figure 18:
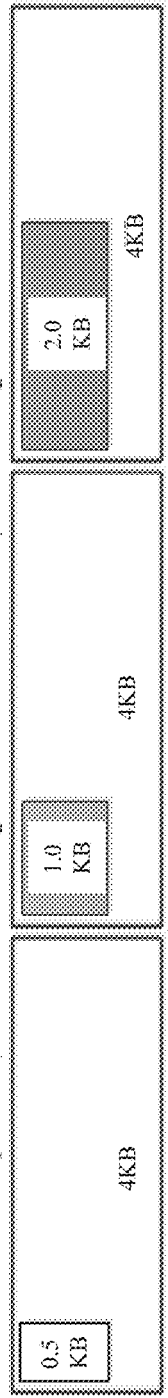
FIG. 18 shows a schematic view of a conventional method for compaction of compressed and uncompressed data blocks into solid state drive memory.
Figure 19:
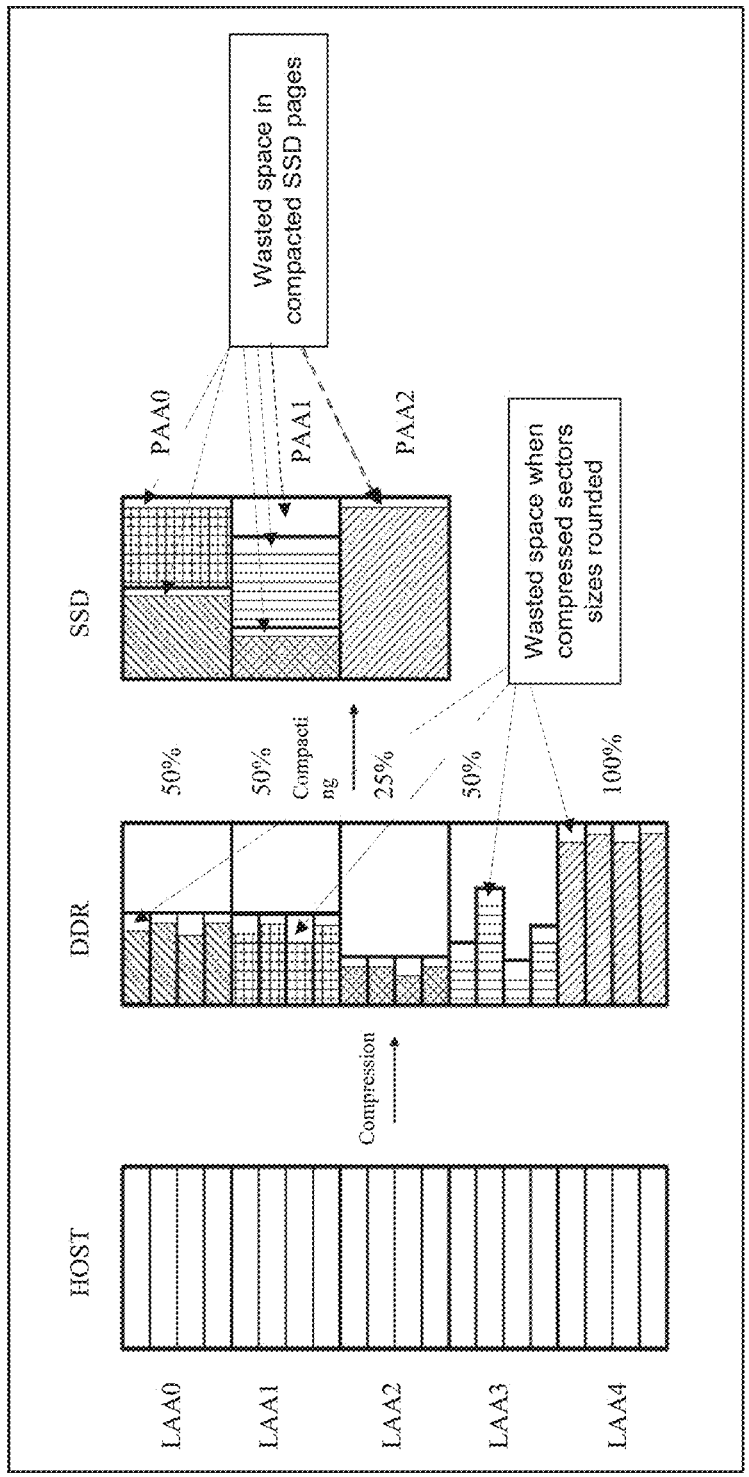
FIG. 19 shows a schematic view of a method for compression and compacting of input data files into a memory device according to prior art.

FIG. 13 shows a schematic view of a method for reading compressed and uncompressed data blocks from a memory storage according to various embodiments.

At 1301, the device 100 starts a first step for reading a data block from the memory storage. The device 100 initiate the block reading using the block address.

At 1302, the device 100 parses the block address and derives the chunk ID, offset and length, as discussed above.

The device 100 uses the chunk identifier (chunk ID) to locate the chunk start on the storage media. Then, the device 100 uses the block address offset to find the location of the data block in the chunk.

At 1303, the device 100 reads data from the chunk according to chunk ID, offset and length.

The device 100 adjusts the length of the data block (i.e. which may be a compressed data block or an uncompressed data block), and may read the data block as a number of sequential grain units.

For example, when the length of the data block, encoded in the respective bit-field of the block address is equal to [(1<<length-Bits)−1], then the data block is an uncompressed data block. And the device 100 reads the [(1<<length-Bits)] grain units. However, when the length of the data block, encoded in the respective bit-field of the block address is in the ranges of 0 to [(1<<length-Bits)-2], then the data block is a compressed data block, and the device 100 reads the [(length+2)] grain units.

At 1304, the device 100 determines if the data block is a non-compressed block or not. Moreover, when it is determined that the data block is an uncompressed data block, the device 100 proceeds to step 1311. However, when it is determined that the data block is not an uncompressed data block, the device 100 proceeds to step 1305.

At 1305, the device 100 parses the block start header, the device 100 derives the size of the compressed data block and bytes offset in the first grain unit.

The device 100 parses the leading and the trailing headers for the compressed data block, to determine the start position of the compressed data block in the first read grain unit, and the end position of the compressed data block in the last grain unit.

At 1306, the device 100 allocates a temporary buffer. The temporary buffer is corresponding to the derived block size.

At 1307, the device 100 copies the block first part to the output buffer, starting from the offset till the last unit.

At 1308, the device 100 skips the end header in block last unit.

At 1309, the device 100 copies the block's second part to the output buffer from the last grain unit.

Moreover, when the last grain unit contains a compressed data block, then the device 100 moves the compressed data block "in place" (i.e. to the beginning of the grain unit) to overwrite the trailing header, and further makes the compressed data blocks contiguous.

At 1310, the device 100 decompresses the unpacked block.

The device 100 decompresses contiguous compressed data and returns them to the original block content.

At 1311, the device 100 reads the decompressed data block and ends the read process.

Table I presents benchmarking results of compression and packing of two set of data based on a method disclosed in the prior art, and Table II presents benchmarking results of compression and packing of two set of data based on the device (or the method run by the device), as disclosed in the present disclosure.

The benchmarking results for the prior art solution (a prototype implementation of the proposed solution in the prior art) and for the stand-alone application prototype for the present disclosure are obtained based on the following conditions.

1. Implemented chunk packing and block addresses calculation
2. Data read in memory—no IO (disk) overhead is taken into account 3. Repeated (packing, compression), and (unpacking, decompression) for 100 times and averages speed
4. Blocks compression/decompression is done in single thread
5. LZ-class algorithm is used as compressor in default and solution packing schemes In addition, the environment for obtaining the benchmarking results was an Intel® Xeon® CPU E5-2670 0 @ 2.60 GHz, wherein the benchmarking was compiled with GCC 6.3-O3, Linux kernel 3.19.

TABLE I

Benchmarking rresults of compression and packing of two set of data based on method disclosed in prior art.

Baseline (prior art), alignment by 1 KB grain units, packing compressed data into 1 MB chunks

| Data set | Memory waste | CPU waste | CR % output/input | Compression speed B/sec | Decompression speed, MB/sec |
|---|---|---|---|---|---|
| Oracle DB | 9.4 | 0.4 | 49.8 | 456 | 1593 |
| Calgary, Silesia, etc. | 6.1 | 4.4 | 60.5 | 314 | 1060 |

TABLE II

Benchmarking rresults of compression and packing of two set of data based on the device (or the method run by the device) as disclosed in the present disclosure.

Present disclosure: no alignment by 1 KB units, 4 byte headers while packing compressed data into 1 MB chunks

| Data set | Memory waste | CPU waste | CR % output/input | Compression speed, MB/sec | Decompression speed, MB/sec |
|---|---|---|---|---|---|
| Oracle DB | 0.1 | 0.3 | 39.3 | 649 | 1681 |
| Calgary, Silesia, etc. | 0.1 | 4.2 | 53.6 | 418 | 1510 |

The benchmarking results of the present disclosure provides 13-27% of better data reduction ratio, and 6-42% of better speed as compared to typical inline compression packing scheme of the method disclosed in prior art. Furthermore, the present disclosure makes waste elimination close to "ideal" for selected LZ4 like algorithm.

The present disclosure deals with actual compressed data sizes in packing scheme, and decreases waste of SSD memory to minimum as compared to typical inline compression packing scheme in the prior art. For example, for the Oracle DB dataset, the memory waste (% input) of 9.4% decreased down to 0.1%, and for the Standard datasets, the memory waste of 6.1% decreased down to 0.1%

The present disclosure has been described in conjunction with various embodiments as examples as well as implementations. However, other variations can be understood and effected by those persons skilled in the art and practicing the claimed disclosure, from the studies of the drawings, this disclosure and the independent claims. In the claims as well as in the description the word "comprising" does not exclude other elements or steps and the indefinite article "a" or "an" does not exclude a plurality. A single element or other unit may fulfill the functions of several entities or items recited in the claims. The mere fact that certain measures are recited in the mutual different dependent claims does not indicate that a combination of these measures cannot be used in an advantageous implementation.

What is claimed is:

1. A device for compacting compressed and uncompressed data blocks into an output buffer, comprising:
    an interface;
    the output buffer; and
    a processor coupled to the interface and the output buffer, and wherein the processor is configured to:
        obtain a set of input data blocks comprising at least one of a compressed data block and an uncompressed data block;
        compact the compressed data blocks into the output buffer, starting from a first predefined region in the output buffer, wherein the compressed data blocks are sequentially compacted; and
        compact the uncompressed data blocks into the output buffer, starting from a second predefined region in the output buffer, wherein the uncompressed data blocks are sequentially compacted;
        wherein a beginning of the second predefined region is an end of the output buffer, and the uncompressed data blocks are sequentially compacted from the end of the output buffer growing toward the beginning of the output buffer.

2. The device according to claim 1, wherein the processor is further configured to determine an upper limit in bytes for a compressed data block to be compacted into the output buffer, based on an output buffer size, a size of the compressed data block, and a header size of the compressed data block.

3. The device according to claim 1, wherein the processor is further configured to obtain an input data block, compress the obtained input data block based on a predefined compression ratio, and determine a size of the compressed data block.

4. The device according to claim 3, wherein in response to the size of the compressed data block being less than the grain unit of output buffer, the processor is further configured to perform a copy-add of the compressed data into a separate output buffer being associated to the compressed data blocks having a size smaller than the grain unit, wherein the grain unit is representative of granularity of a memory storage.

5. The device according to claim 1, wherein the first predefined region is the beginning of the output buffer, and wherein the compressed data blocks are sequentially compacted from the beginning of the output buffer growing toward the end of the output buffer.

6. The device according to claim 5, wherein the compaction of the compressed data blocks into the output buffer is gapless and/or independent from the grain unit of the output buffer.

7. The device according to claim 1, wherein the compaction of the uncompressed data blocks into the output buffer is arranged based on the grain unit of the output buffer.

8. The device according to claim 1, wherein the processor is further configured to determine a block address for the compressed data block based on determining an offset for the compressed data block in the output buffer, and estimating a length of the compressed data block in the output buffer.

9. The device according to claim 8, wherein the block address of a compressed data block having a size less than the grain unit corresponds to an index of the grain unit.

10. The device according to claim 1, wherein the processor is further configured to determine a block address for the uncompressed data block based on determining an offset for the uncompressed data block in the output buffer, and estimating a length of the uncompressed data block in output buffer.

11. The device according to claim 1, wherein the processor is further configured to generate a block leading header for each compressed data block, being representative of an offset from a beginning of the grain unit.

12. The device according to claim 1, wherein the processor is further configured to generate a block trailing header for each compressed data block, being representative of an offset of the last byte of the compressed data block from a beginning of the last grain unit of the compressed data block.

13. The device according to claim 3, wherein the processor is further configured to write the compressed data blocks and the uncompressed data blocks on the memory storage.

14. The device according to claim 13, wherein the compressed data blocks and the uncompressed data blocks are written on the memory storage based on their corresponding compaction on the output buffer.

15. The device according to claim 3, wherein the processor is further configured to read from the memory storage the compressed data blocks and the uncompressed data blocks.

16. The device according to claim 15, wherein the processor is further configured to read the compressed data blocks and the uncompressed data blocks based on the identification number of the output buffer, the size of the corresponding block, and the offset of the corresponding block from the beginning of the output buffer.

17. The device according to claim 3, wherein the memory storage is based on a volatile memory storage or a non-volatile memory storage.

18. A method for compacting compressed and uncompressed data blocks into an output buffer, the method comprising:
   obtaining, by a processor of a device, a set of input data blocks comprising at least one of a compressed data block and an uncompressed data block;
   compacting, by the processor of the device, the compressed data blocks into the output buffer, starting from a first predefined region in the output buffer, such that the compressed data blocks are sequentially compacted; and
   compacting, by the processor of the device, the uncompressed data blocks into the output buffer, starting from a second predefined region in the output buffer, such that the uncompressed data blocks are sequentially compacted; and
   wherein a beginning of the second predefined region is an end of the output buffer, and the uncompressed data blocks are sequentially compacted from the end of the output buffer growing toward the beginning of the output buffer.

19. The method according to claim 18, further comprising:
   determining an upper limit in bytes for a compressed data block to be compacted into the output buffer, based on an output buffer size, a size of the compressed data block, and a header size of the compressed data block.

20. The method according to claim 18, further comprising:
   obtaining an input data block, compress the obtained input data block based on a predefined compression ratio, and determining a size of the compressed data block.

* * * * *